US009666518B1

(12) United States Patent
Funatsu et al.

(10) Patent No.: US 9,666,518 B1
(45) Date of Patent: May 30, 2017

(54) SEMICONDUCTOR DEVICE

(71) Applicant: Renesas Electronics Corporation, Tokyo (JP)

(72) Inventors: Katsuhiko Funatsu, Tokyo (JP); Yukihiro Sato, Tokyo (JP); Takamitsu Kanazawa, Tokyo (JP); Masahiro Koido, Tokyo (JP); Hiroyoshi Taya, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/420,410

(22) Filed: Jan. 31, 2017

Related U.S. Application Data

(63) Continuation of application No. 14/863,894, filed on Sep. 24, 2015, now Pat. No. 9,576,885.

(30) Foreign Application Priority Data

Sep. 30, 2014 (JP) ................................ 2014-199822

(51) Int. Cl.
H01L 23/498 (2006.01)
H01L 25/07 (2006.01)
(Continued)

(52) U.S. Cl.
CPC ........ *H01L 23/49838* (2013.01); *H01L 21/52* (2013.01); *H01L 21/54* (2013.01);
(Continued)

(58) Field of Classification Search
CPC ....... H01L 23/02; H01L 23/04; H01L 23/043; H01L 23/045; H01L 23/047; H01L 23/049; H01L 23/053; H01L 23/055; H01L 23/057; H01L 23/12; H01L 23/13; H01L 23/495; H01L 23/49517; H01L 23/4952;
(Continued)

(56) References Cited

U.S. PATENT DOCUMENTS 5,527,620 A  6/1996  Schulz-Harder
6,208,020 B1  3/2001  Minamio et al.
(Continued)

FOREIGN PATENT DOCUMENTS

DE   4318241    12/1994
EP   1089334    4/2001
JP   2009-094135  4/2009

OTHER PUBLICATIONS

Extended European Search Report received in corresponding European Application No. 15187405.4 dated Feb. 3, 2016.

Primary Examiner — Eduardo A Rodela
(74) Attorney, Agent, or Firm — Mattingly & Malur, PC

(57) ABSTRACT

A semiconductor device includes a plurality of metal patterns formed on a ceramic substrate, and a semiconductor chip mounted on some of the plurality of metal patterns. Also, a plurality of hollow portions are formed in peripheral portions of the plurality of metal patterns. In addition, the plurality of hollow portions are not formed in a region overlapping the semiconductor chip in the plurality of metal patterns. Furthermore, the plurality of hollow portions are provided in a plurality of metal patterns arranged at a position closest to the peripheral portion of the top surface of the ceramic substrate among the plurality of metal patterns.

7 Claims, 20 Drawing Sheets

(51) Int. Cl.
*H01L 23/053* (2006.01)
*H01L 23/10* (2006.01)
*H01L 23/00* (2006.01)
*H01L 21/52* (2006.01)
*H01L 21/54* (2006.01)
*H01L 23/16* (2006.01)
*H01L 29/417* (2006.01)
*H01L 23/04* (2006.01)
*H01L 23/02* (2006.01)
*H01L 23/057* (2006.01)
*H02S 40/32* (2014.01)

(52) U.S. Cl.
CPC .............. *H01L 23/02* (2013.01); *H01L 23/04* (2013.01); *H01L 23/053* (2013.01); *H01L 23/057* (2013.01); *H01L 23/10* (2013.01); *H01L 23/16* (2013.01); *H01L 23/498* (2013.01); *H01L 23/49811* (2013.01); *H01L 24/48* (2013.01); *H01L 24/73* (2013.01); *H01L 24/83* (2013.01); *H01L 24/85* (2013.01); *H01L 24/92* (2013.01); *H01L 25/072* (2013.01); *H01L 29/41708* (2013.01); *H01L 2224/32225* (2013.01); *H01L 2224/45014* (2013.01); *H01L 2224/45124* (2013.01); *H01L 2224/45139* (2013.01); *H01L 2224/45144* (2013.01); *H01L 2224/4813* (2013.01); *H01L 2224/48091* (2013.01); *H01L 2224/48101* (2013.01); *H01L 2224/48106* (2013.01); *H01L 2224/48227* (2013.01); *H01L 2224/73265* (2013.01); *H01L 2224/92247* (2013.01); *H01L 2924/13055* (2013.01); *H02S 40/32* (2014.12)

(58) Field of Classification Search
CPC ............. H01L 23/49541; H01L 23/498; H01L 23/49811; H01L 23/49838
See application file for complete search history.

(56) References Cited

U.S. PATENT DOCUMENTS

| | | | |
|---|---|---|---|
| 6,388,311 B1 | 5/2002 | Nakashima et al. | |
| 7,692,285 B2* | 4/2010 | Sato | H01L 23/485 257/691 |
| 7,838,973 B2 | 11/2010 | Dimasacat et al. | |
| 2007/0138651 A1* | 6/2007 | Hauenstein | H01L 23/13 257/782 |
| 2012/0160545 A1 | 6/2012 | Sakamoto | |
| 2014/0159054 A1* | 6/2014 | Otake | H01L 24/34 257/77 |
| 2014/0167242 A1 | 6/2014 | Kim | |
| 2014/0231926 A1* | 8/2014 | Okumura | H01L 25/04 257/401 |
| 2015/0103498 A1* | 4/2015 | Lee | H01L 23/49811 361/737 |
| 2015/0187726 A1 | 7/2015 | Park | |
| 2016/0133533 A1* | 5/2016 | Lin | H01L 24/83 257/766 |

* cited by examiner

SEMICONDUCTOR DEVICE

CROSS-REFERENCE TO RELATED APPLICATION

The present application claims priority from Japanese Patent Application No. 2014-199822 filed on Sep. 30, 2014, the content of which is hereby incorporated by reference into this application.

TECHNICAL FIELD OF THE INVENTION

The present invention relates to a semiconductor device, and relates to a technique effectively applied to, for example, a semiconductor device on which a plurality of semiconductor chips are mounted on a ceramic substrate through a plurality of metal patterns.

BACKGROUND OF THE INVENTION

Japanese Patent Application Laid-Open Publication No. 2009-94135 (Patent Document 1) describes an embodiment in which a dimple is formed on a conductive pattern provided on a ceramic substrate so that a solder layer for mounting a semiconductor chip is filled also in the dimple.

SUMMARY OF THE INVENTION

There is a semiconductor device having a plurality of semiconductor chips mounted on a ceramic substrate through a conductive pattern. Since the ceramic substrate has excellent high-frequency characteristics and thermal conductivity, the ceramic substrate is used in, for example, a semiconductor device of power system (power control system) such as a power conversion device.

In the semiconductor device using the ceramic substrate, a plurality of semiconductor chips or external input/output terminals are connected to a metal pattern bonded on the ceramic substrate. However, it has been found out that the metal pattern is peeled off from the ceramic substrate if an ambient temperature of the semiconductor device using the ceramic substrate is changed since a difference in a linear expansion coefficient between a ceramic material and a metal material is large.

Other object and novel characteristics of the present invention will be apparent from the description of the present specification and the accompanying drawings.

A semiconductor device according to an embodiment includes a plurality of metal patterns formed on a ceramic substrate, and a plurality of semiconductor chips mounted on one or some of the plurality of metal patterns. In addition, a plurality of hollow portions are formed in peripheral portions of the plurality of metal patterns. In addition, the plurality of hollow portions are not formed in regions overlapping the plurality of semiconductor chips among the plurality of metal patterns. Furthermore, the plurality of hollow portions are provided in the plurality of metal patterns disposed at a position closest to a peripheral portion of a first surface of the ceramic substrate among the plurality of metal patterns.

According to the above-described embodiment, the reliability of the semiconductor device can be improved.

BRIEF DESCRIPTIONS OF THE DRAWINGS

Figure 1:
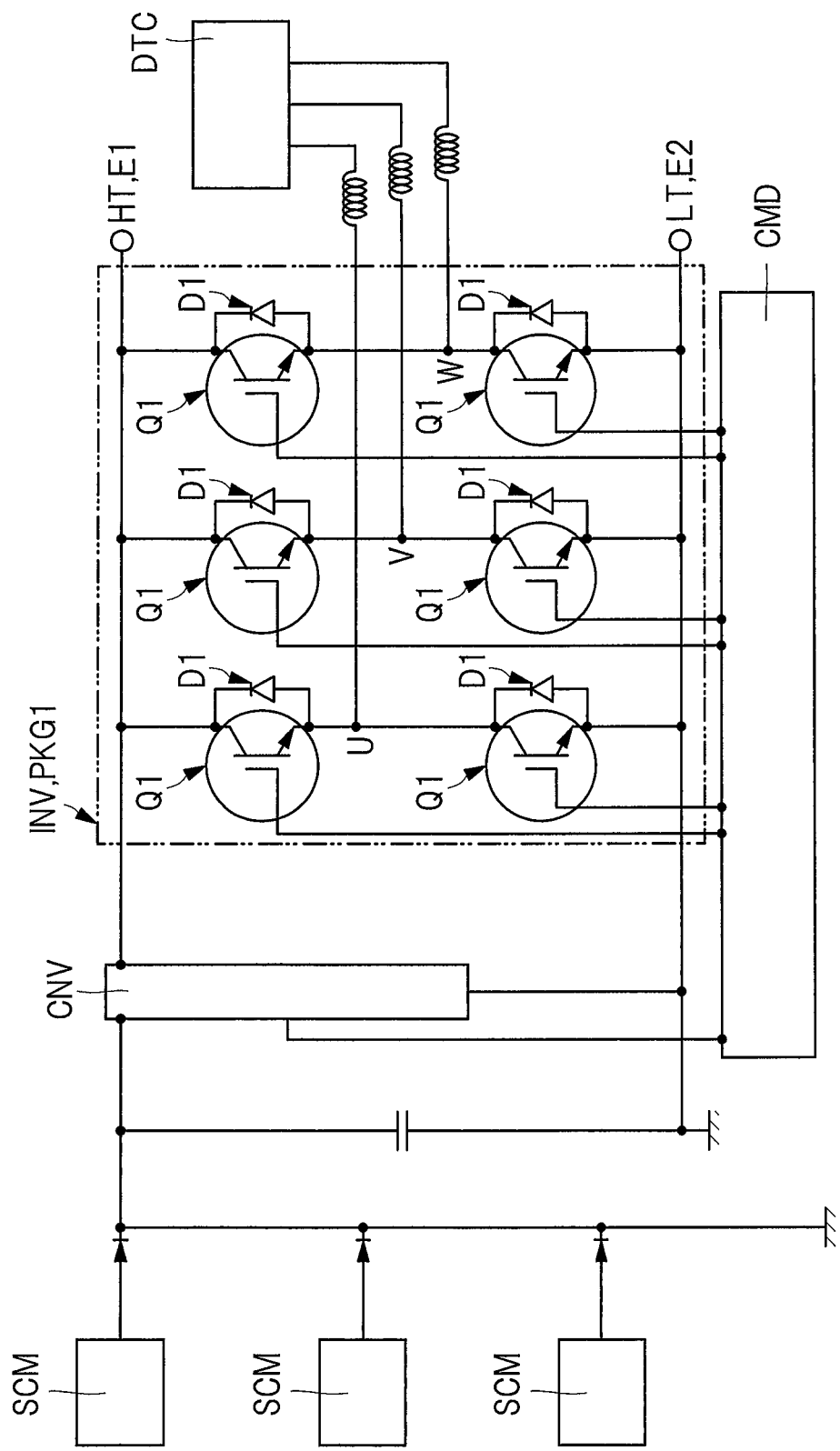
FIG. 1 is an explanatory diagram illustrating a configuration example of a power conversion system in which a semiconductor device according to an embodiment is embedded.

DESCRIPTIONS OF THE PREFERRED EMBODIMENTS (Description of Format, Basic Terms, and Usage in Present Application)

In the present application, the description of embodiments is divided into a plurality of sections for convenience as needed. However, unless otherwise indicated specifically, these are mutually independent and separated, and are each part of a single example, or one of them is a detailed part of the other or is all or partial modification, regardless before and after the description. In addition, in practice, repetitive descriptions of the same parts will be omitted. In addition, unless otherwise indicated specifically, each element of an embodiment is not essential, except for a case where the number thereof is limited in theory and a case that is clearly otherwise from the content.

Similarly, in the description of embodiments or others, the expression "X including A" in a material, a composition, or others does not exclude those including components other than A, unless otherwise indicated specifically and except for a case indicating clearly that they are not so from the context. For example, as for a component, it means "X including A as a main component". For example, even when a "silicon member" or others is mentioned, it is needless to say that this mention is not limited to pure silicon, and that this mention includes also a silicon germanium (SiGe) alloy, a multi-element alloy containing other silicon as a main component, and a member containing other additives or others. In addition, even when gold plating, a Cu layer, nickel plating, or others is mentioned, these mentions include not only a pure member but also members containing gold, Cu, nickel, or others as main components, respectively, unless otherwise indicated specifically.

Furthermore, even when a specific value or amount is mentioned, it may be a value larger than the specific value or a value smaller than the specific value unless otherwise indicated specifically and except for a case that the number thereof is logically limited to the specific value and a case that the number thereof is clearly not so from the context.

In addition, in each drawing of the embodiments, the same or similar parts are denoted by the same or similar symbols or reference numerals, and descriptions thereof are not repeated in principle.

In addition, in the attached drawings, hatching or others may be omitted even in a cross section in a case where it becomes complicated by the hatching or a case that a discrimination from a void is clear. In this regard, an outline of a background may be omitted even in a planarly closed hole in a case the explanation thereof or others is clear. Furthermore, even not for the cross section, hatching or dot patterns may be attached so as to clarify there are no voids or clarify a boundary of a region.

<Configuration Example of Power Conversion System>

In the present embodiment to be described below in detail with reference to the drawings, as an example of a semiconductor device in which a plurality of semiconductor chips are mounted on a ceramic substrate, a power conversion device (inverter device) that converts input direct-current power into alternate-current power will be exemplified and described.

FIG. 1 is an explanatory diagram illustrating a configuration example of a power conversion system in which a semiconductor device of the present embodiment is embedded.

The power conversion system illustrated in FIG. 1 converts direct-current power, which is output from a plurality of solar cell modules SCM, into alternate-current power by an inverter circuit INV and outputs the alternate-current power to a power distribution circuit DTC.

Each of the plurality of solar cell modules SCM is a photoelectric conversion device that converts light energy into electrical energy. Each of the plurality of solar cell modules SCM includes a plurality of solar cells and outputs power converted into electrical energy in each of the plurality of solar cells as a direct-current power.

In addition, a converter circuit CNV is connected between the plurality of solar cell modules SCM and the inverter circuit INV illustrated in FIG. 1. In the example illustrated in FIG. 1, the direct-current power, which is output from the plurality of solar cell modules SCM, is boosted to high-voltage direct-current power by the converter circuit CNV. That is, the converter circuit CNV illustrated in FIG. 1 is a so-called DC/DC converter that converts a direct-current power into a relatively high-voltage direct-current power.

In addition, the alternate-current power, which is power-converted by the inverter circuit INV, is output to the power distribution circuit DTC. In the example illustrated in FIG. 1, by the inverter circuit INV, the power is converted into three-phase alternate-current power having U-phase, V-phase, and W-phase and outputs the three-phase alternate-current power to the power distribution circuit DTC.

In addition, the power conversion system illustrated in FIG. 1 includes a control circuit CMD that controls the above-described power conversion operation. The control circuit CMD outputs a control signals to each switching element of the converter circuit CNV and the inverter circuit INV.

In addition, the inverter circuit INV illustrated in FIG. 1 is a power conversion circuit that converts a direct-current power into an alternate-current power by using a plurality of switching elements. In the example illustrated in FIG. 1, each of six transistors Q1 functions as a switching element.

When the direct-current power is converted to the alternate-current power by using the switching elements, a circuit is used, the circuit having a high-side switch connected to a relatively high potential and a low-side switch connected to a relatively low potential which are connected in series. The high-side switch and the low-side switch are paired to be turned on/off. When one switch of the pair of the high-side switch and the low-side switch is turned on, the other switch is turned off. The pair of the high-side switch and the low-side switch are turned on/off (hereinafter, referred to as a switching operation) at a high speed, so that a single-phase alternate-current power is output.

In addition, in the example illustrated in FIG. 1, the inverter circuit INV that converts the direct-current power into the three-phase alternate-current power is described so that three switch pairs each including a high-side switch and a low-side switch are provided so as to correspond to the three phases of the U-phase, the V-phase, and the W-phase. In addition, an output node of each of the three phases of the U-phase, the V-phase, and the W-phase, is connected between the high-side switch and the low-side switch which are connected in series, and each of the switch pairs performs a switching operation so as to have a phase difference of 120 degrees. In this manner, the direct-current power can be converted into the three-phase alternate-current power having the three phases of the U-phase, the V-phase, and the W-phase.

For example, in the example illustrated in FIG. 1, a positive potential E1 is applied to a high-side terminal HT, and a potential E2 is applied to a low-side terminal LT. At this time, a potential of each of a U-phase node, a V-phase node, and a W-phase node changes to 0 and E1 in accordance with the switching operations of three sets of the switching pairs. Then, for example, a line voltage between the U-phase and the V-phase is obtained by subtracting a V-phase potential from a U-phase potential, and therefore, the line voltage changes to +E1 [V], 0 [V], and −E1 [V]. In addition, a line voltage between the V-phase and the W-phase has a voltage waveform whose phase is shifted by 120 degrees with respect to the line voltage between the U-phase and the V-phase, and besides, a line voltage between a W-phase and a U-phase has a voltage waveform whose phase is shifted by 120 degrees with respect to the line voltage between the V-phase and the W-phase. That is, when the direct-current power is input to the inverter circuit INV, the voltage waveform of the three-phase alternate-current power is obtained.

In addition, a transistor Q1 configuring the switching element of the inverter circuit INV illustrated in FIG. 1 is an insulated gate bipolar transistor (hereinafter, referred to as IGBT). As the transistor Q1 that is the switching element, a power metal oxide semiconductor field effect transistors (MOSFET) may be used. Since the power MOSFET is a voltage-driven type that controls the switching operation by a voltage applied to a gate electrode, the power MOSFET has an advantage that can perform high-speed switching.

However, the power MOSFET has properties that an on-resistance becomes higher as increase in a breakdown voltage is more achieved, which results in a higher heat generation amount. Therefore, the IGBT is preferable as the transistor Q1 that is used in applications requiring high-power and high-speed switching operations. The IGBT is a semiconductor device that is configured by a combination of a power MOSFET and a bipolar transistor and has both of the high-speed switching characteristics of the power MOSFET and the high breakdown characteristics of the bipolar transistor. As described above, the inverter circuit INV according to the first embodiment adopts the IGBT as the switching element.

In addition, in the inverter circuit INV, a transistor Q1 and a diode D1 are connected in antiparallel between the high-side terminal HT and each phase (U-phase, V-phase, and W-phase) of the three-phase alternate-current, and a transistor Q1 and a diode D1 are connected in antiparallel between each phase of the three-phase alternate-current and the low-side terminal LT. That is, two transistors Q1 and two diodes D1 are provided in each single-phase, and six transistors Q1 and six diodes D1 are provided in three phases. The control circuit CMD is connected to a gate electrode of the individual transistor Q1, and the switching operation of the transistor Q1 is controlled by the control circuit CMD. The diode D1 has a function of supplying a reflux current for releasing electrical energy accumulated in an inductance connected to an output side of the inverter circuit INV.

<Semiconductor Device>

Figure 2:
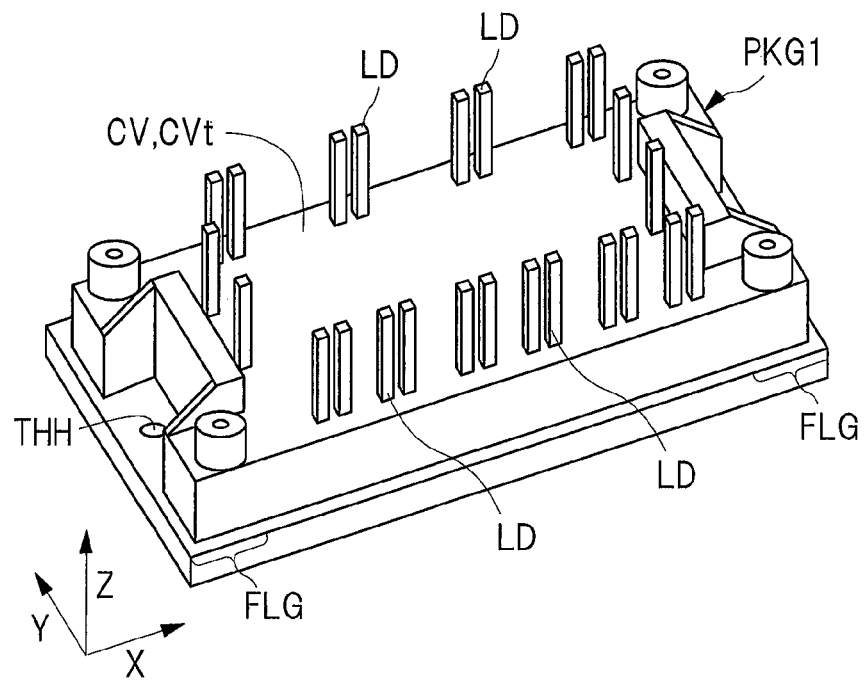
FIG. 2 is a perspective view illustrating an appearance of the semiconductor device illustrated in FIG. 1.
Figure 3:
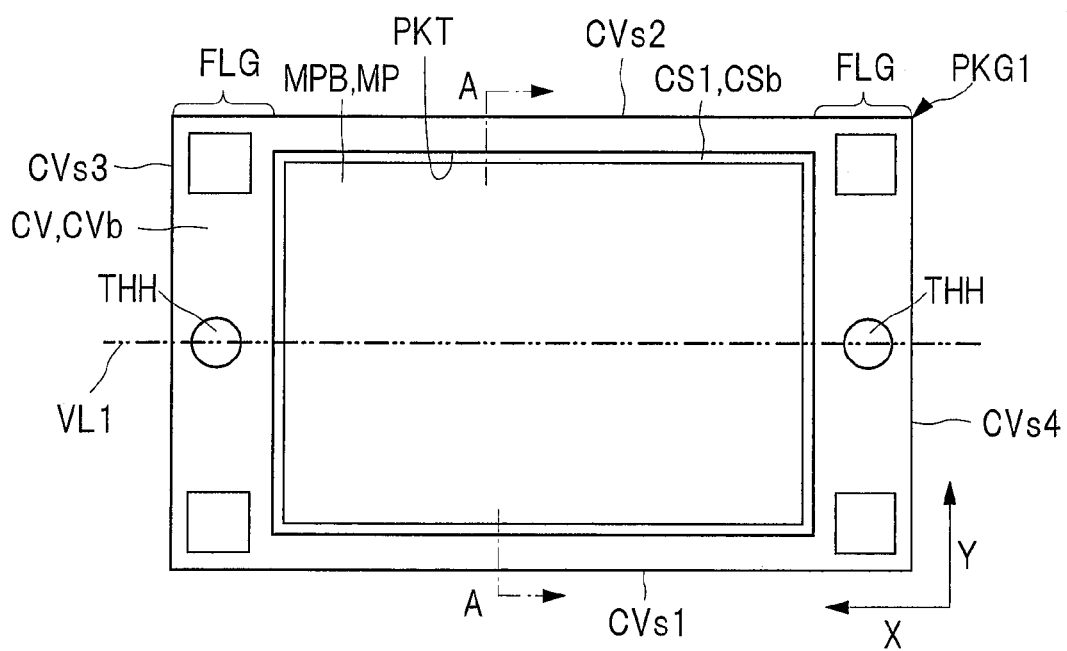
FIG. 3 is a plan view illustrating a rear surface side of the semiconductor device illustrated in FIG. 2.
Figure 4:
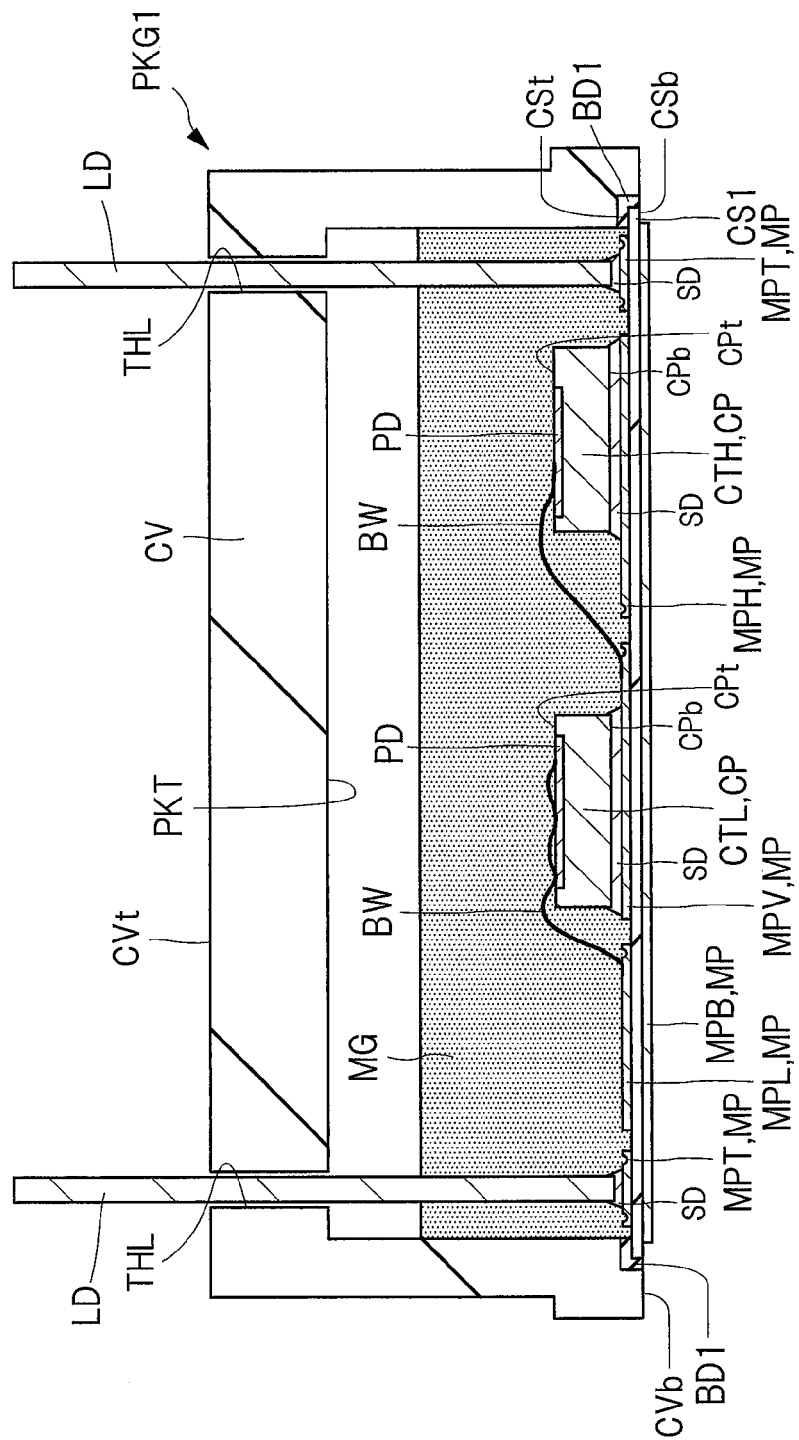
FIG. 4 is a cross-sectional view taken along a line A-A of FIG. 3.
Figure 5:
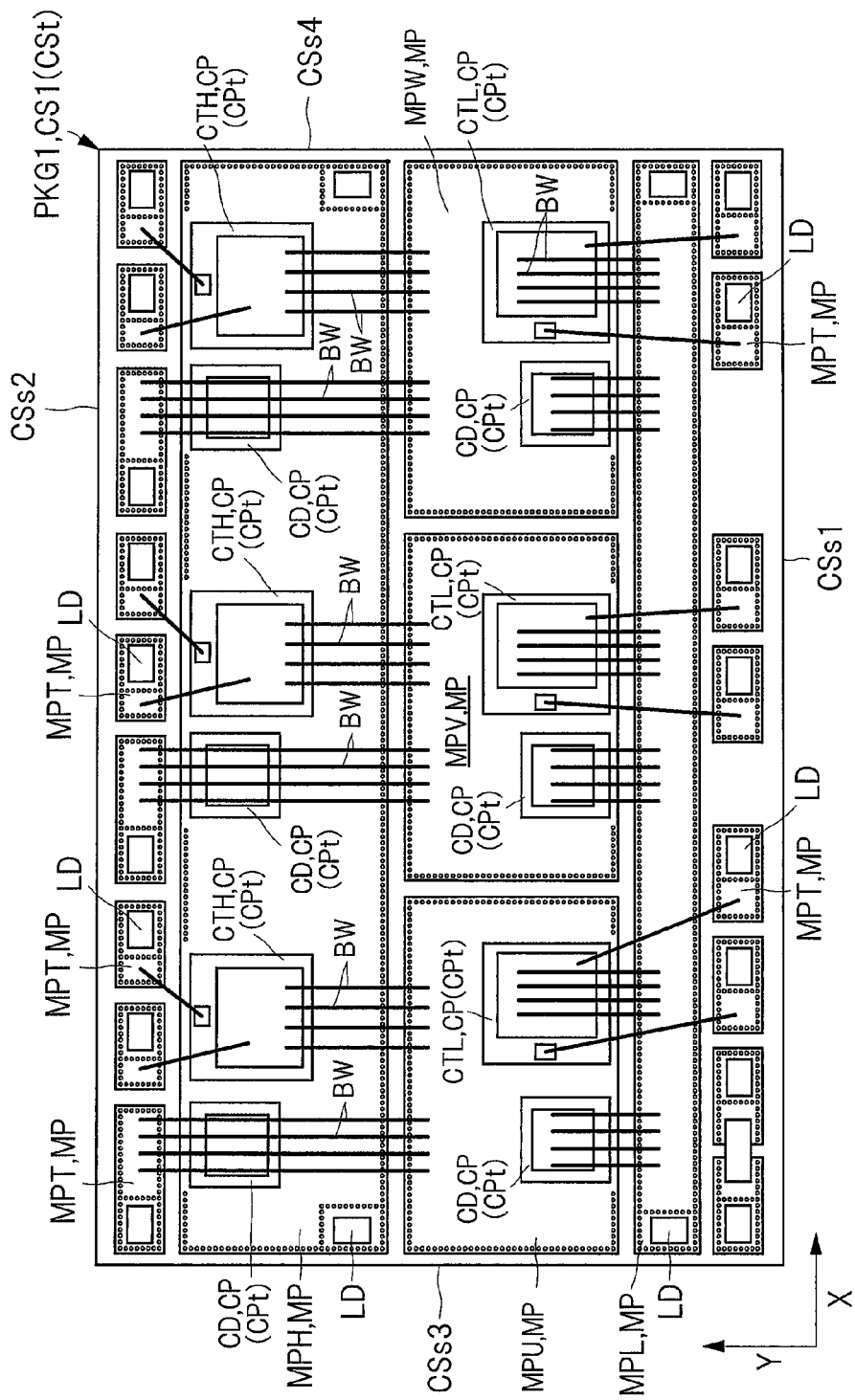
FIG. 5 is a plan view illustrating a layout of a top surface side of a ceramic substrate illustrated in FIG. 3.
Figure 6:
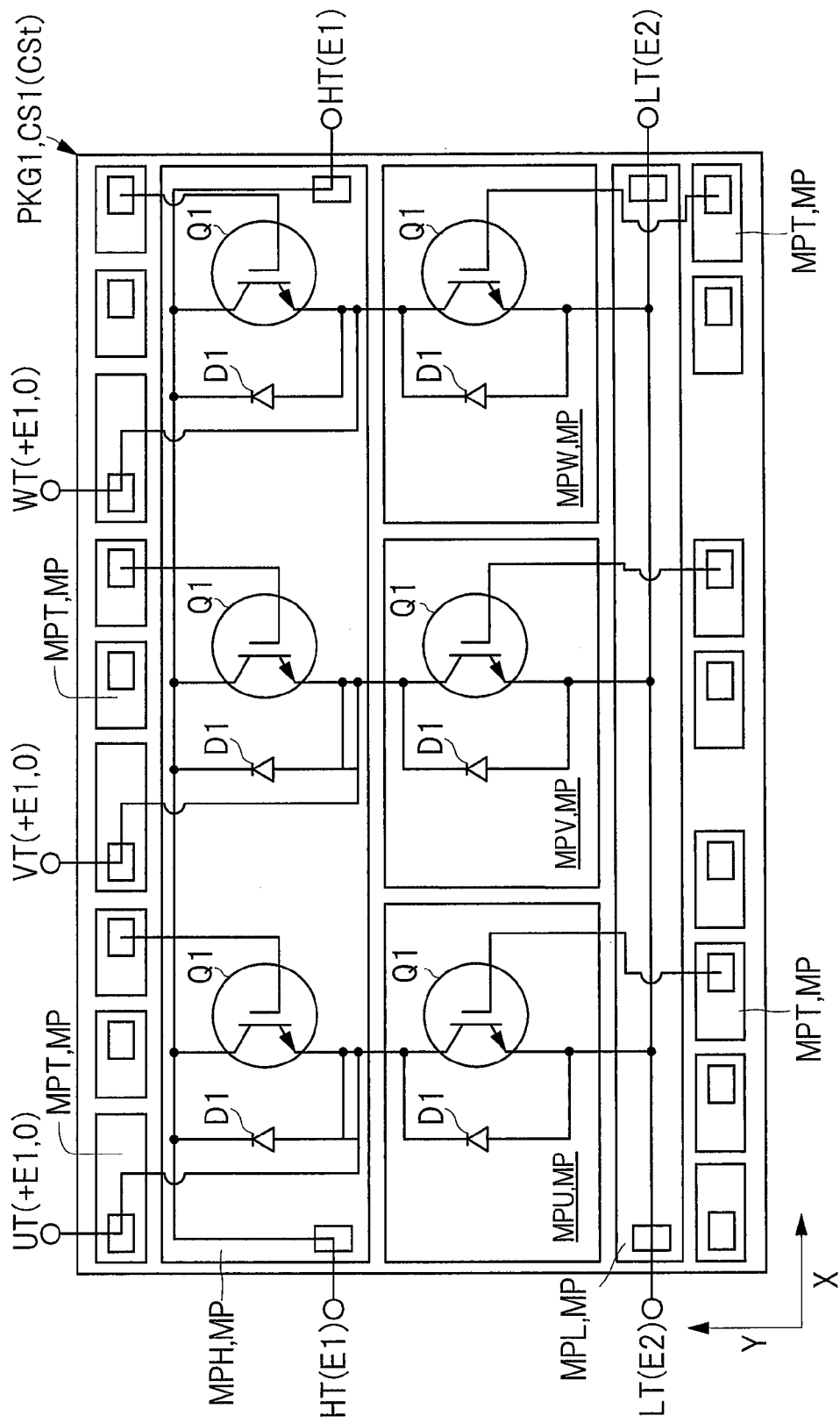
FIG. 6 is an explanatory diagram schematically illustrating an inverter circuit configured by a plurality of semiconductor chips illustrated in FIG. 5.
Figure 7:
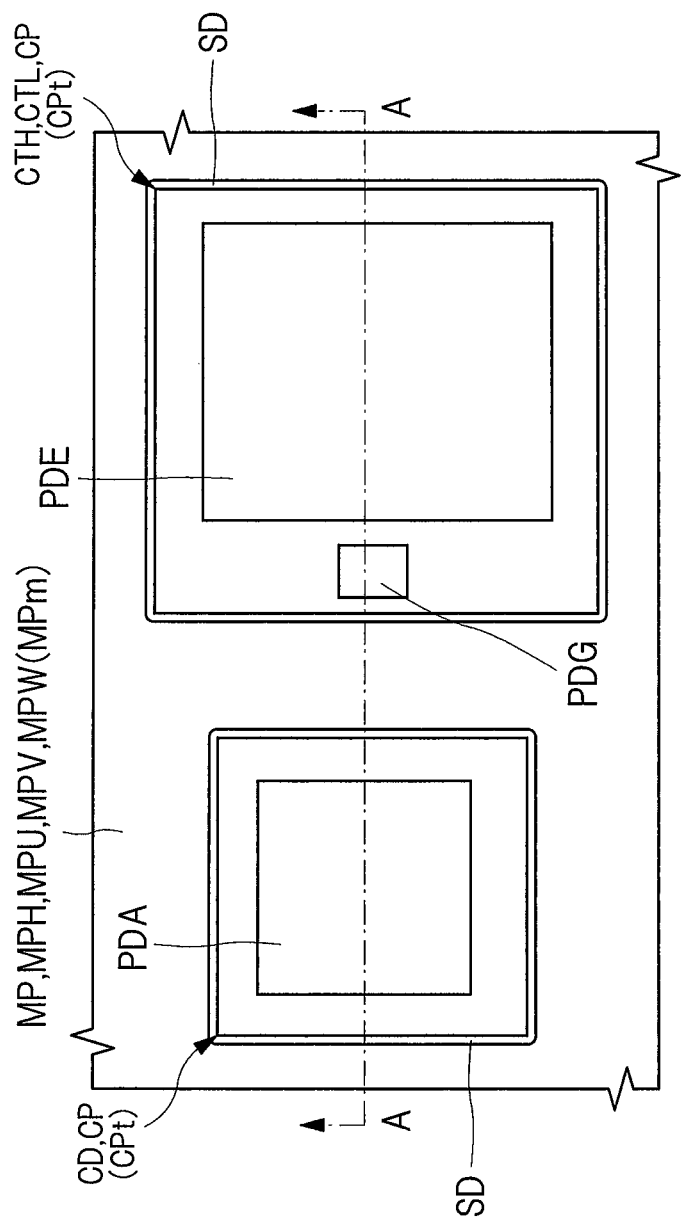
FIG. 7 is an enlarged plan view illustrating a periphery of the semiconductor chip illustrated in FIG. 5 so as to be enlarged.
Figure 8:
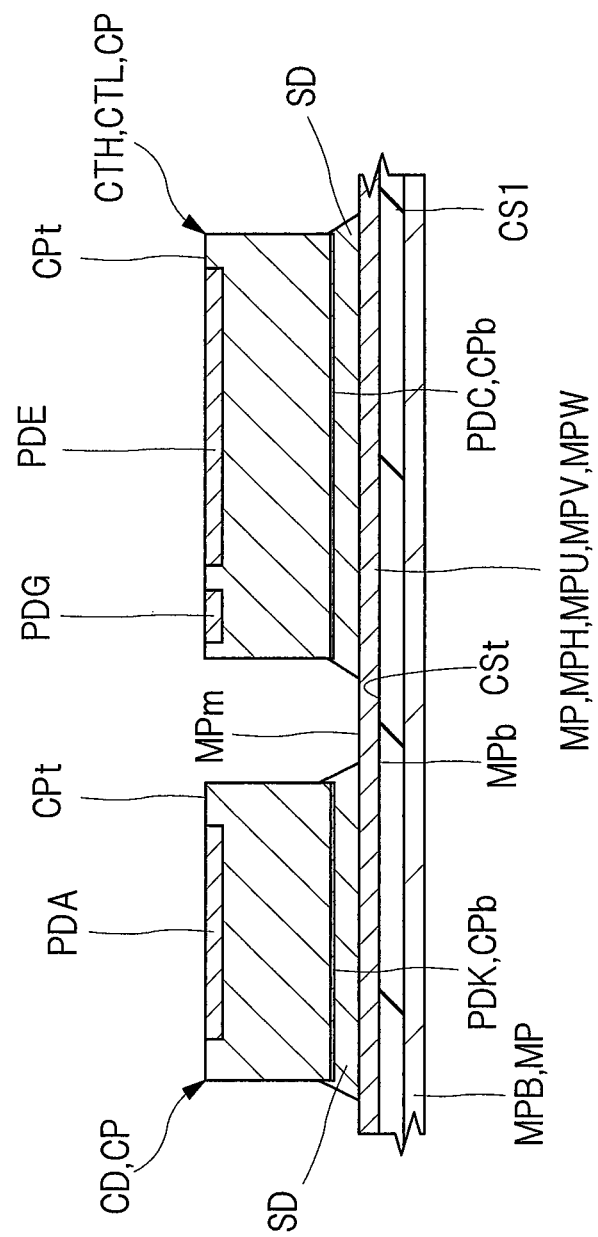
FIG. 8 is an enlarged cross-sectional view taken along a line A-A of FIG. 7.

Next, a configuration example of a semiconductor device PKG1 configuring the inverter circuit INV illustrated in FIG. 1 will be described. FIG. 2 is a perspective view illustrating an appearance of the semiconductor device illustrated in FIG. 1. In addition, FIG. 3 is a plan view illustrating a rear surface side of the semiconductor device illustrated in FIG. 2. In addition, FIG. 4 is a cross-sectional view taken along a line A-A of FIG. 3. In addition, FIG. 5 is a plan view illustrating a layout of atop surface side of a ceramic substrate illustrated in FIG. 3. In addition, FIG. 6 is an explanatory diagram schematically illustrating a circuit configured by the semiconductor device illustrated in FIG. 5. In addition, FIG. 7 is an enlarged plan view illustrating a periphery of a semiconductor chip illustrated in FIG. 5 so as to be enlarged. In addition, FIG. 8 is an enlarged cross-sectional view taken along a line A-A of FIG. 7.

Note that FIG. 7 illustrates one semiconductor chip CP including a transistor and one semiconductor chip CD including a diode as a typical example of a plurality of semiconductor chips CP illustrated in FIG. 5. Since a semiconductor chip CTH and a semiconductor chip CTL illustrated in FIG. 5 have the same structure, one semiconductor chip CP is typically illustrated.

As illustrated in FIG. 2, the top surface side of the semiconductor device PKG1 of the present embodiment, which configures the inverter circuit INV illustrated in FIG. 1, is covered with a cover member (a cap or a cover member). As illustrated in FIG. 4, the cover member CV includes an accommodation portion (pocket) PKT that accommodates a plurality of semiconductor chips CP. The cover member CV covers a top surface CSt of a ceramic substrate CS1 that is a substrate on which a plurality of semiconductor chips CP is mounted. A peripheral portion of the top surface CSt of the ceramic substrate CS1 is adhered and fixed to the cover member CV through an adhesive BD1. The cover member CV is a resin member and is made of, for example, an epoxy-based resin.

In addition, a plurality of terminals LD protrude from a top surface CVt of the cover member CV. A plurality of through-holes THL are formed on the top surface CVt of the cover member CV, and the plurality of terminals LD are inserted into the plurality of through-holes THL, respectively. The plurality of terminals LD are external terminals of the semiconductor device PKG1 and are electrically connected to the plurality of semiconductor chips CP mounted on the ceramic substrate CS1 illustrated in FIG. 5, respectively.

In addition, as illustrated in FIG. 3, when seen in a plan view, the cover member CV of the semiconductor device PKG1 has a side CVs1 extending along an X direction, a side CVs2 located on an opposite side of the side CVs1, a side CVs3 extending along a Y direction perpendicular to the X direction, and a side CVs4 located on an opposite side of the side CVs3. In addition, the side CVs1 and the side CVs2 are longer than the side CVs3 and the side CVs4. In the example illustrated in FIG. 3, note that the cover member CV of the semiconductor device PKG1 forms a quadrangle (a rectangle in FIG. 3) when seen in a plan view. However, as the planar shape of the semiconductor device PKG1, there are various modification examples other than the quadrangle. For example, a pentagon may be obtained by cutting an intersection point, at which the side CVs3 and the side CVs1 intersects with each other among four corners of the quadrangle, diagonally to the X direction and the Y direction. In this case, the diagonally-cut corner can be used as an alignment mask for identifying orientation of the semiconductor device PKG1.

In addition, as illustrated in FIGS. 2 and 3, the cover member CV has a flange portions FLG that is an attachment part for fixing the semiconductor device PKG1 to, for example, a heat sink, a support member, or others. As illustrated in FIG. 3, the flange portion FLG is provided on both sides of the accommodation portion PKT along the X direction that is a longitudinal direction. In addition, a through-hole THH is formed in each of the centers of the plurality of flange portions FLG. The through-hole THH is an opening that penetrates through the flange portion FLG of the cover member CV in a thickness direction. When the semiconductor device PKG1 is fixed to, for example, the heat sink, the support member, or others, the semiconductor device PKG1 can be fixed by screws by inserting the screws (not illustrated) into the through-holes THH.

In the example illustrated in FIG. 3, two through-holes THH are formed along a virtual line (center line) VL1 extending along the X direction that is the longitudinal direction. However, there are various modification examples in a formation position of the through-hole THH. For example, the through-hole THH may be provided at each of four corners of the cover member CV on a bottom surface CVb side illustrated in FIG. 3.

Next, the ceramic substrate CS1 accommodated in the accommodation portion PKT of the cover member CV of the semiconductor device PKG1 and each member fixed to the ceramic substrate CS1 will be described.

As illustrated in FIGS. 4 and 5, the semiconductor device PKG1 includes a ceramic substrate CS1, a plurality of metal patterns MP formed on a top surface CSt of the ceramic substrate CS1, and a plurality of semiconductor chips CP mounted on one or some of the plurality of metal patterns MP.

As illustrated in FIG. 4, the ceramic substrate CS1 has the top surface CSt that is a chip mounting surface on which the plurality of semiconductor chips CP are mounted, and a bottom surface CSb located on an opposite side of the top surface CSt. The ceramic substrate CS1 is made of a ceramic material. In the present embodiment, the ceramic substrate CS1 is a plate-shaped member made of, for example, alumina (aluminum oxide: $Al_2O_3$).

As illustrated in FIG. 5, when seen in a plan view, the ceramic substrate CS1 has a substrate side CSs1 extending along the X direction, a substrate side CSs2 located on an opposite side of the substrate side CSs1, a substrate side CSs3 extending along the Y direction perpendicular to the X direction, and a substrate side CSs4 located on an opposite side of the substrate side CSs3. In addition, the substrate side CSs1 and the substrate side CSs2 are relatively longer than the substrate side CSs3 and the substrate side CSs4. In the example illustrated in FIG. 5, the ceramic substrate CS1 forms a quadrangle (a rectangle in FIG. 5) when seen in a plan view.

In addition, as illustrated in FIG. 4, the plurality of metal patterns MP are bonded to the top surface CSt and the bottom surface CSb of the ceramic substrate CS1. The plurality of metal patterns MP are, for example, a laminated film in which a nickel (Ni) film is laminated on a surface of a copper (Cu) film so that the copper film is directly bonded to the top surface CSt or the bottom surface CSb of the ceramic substrate CS1. When the copper film is bonded to a plate member made of a ceramic such as alumina, the bonding is made by using an eutectic reaction. In addition, as a method of laminating the nickel film on the surface of the copper film, for example, an electroplating process can be used.

In addition, a metal pattern MPB disposed on the bottom surface CSb side of the ceramic substrate CS1 is a terminal for heat dissipation and is uniformly formed to cover a large portion of the bottom surface CSb of the ceramic substrate CS1.

In addition, as illustrated in FIG. 6, the plurality of metal patterns MP formed on the top surface CSt of the ceramic substrate CS1 are wiring patterns configuring a part of a wiring path of the inverter circuit INV, and the plurality of metal patterns MP separated from one another is formed.

The plurality of metal patterns MP includes a metal pattern MPH to which the high-side potential E1 is supplied. In addition, the plurality of metal patterns MP include a metal pattern MPL to which the low-side potential E2 is supplied. In addition, the plurality of metal patterns MP include metal patterns MPU, MPV, and MPW to which a potential changing in accordance with the switching operation of the transistor Q1 is supplied. In addition, the plurality of metal patterns MP include a plurality of metal patterns MPT for connecting the terminal LD.

Different potentials are supplied to the metal pattern MPU, the metal pattern MPV, and the metal pattern MPW, respectively, so that the patterns MPU, MPV, and MPW have a phase difference of 120 degrees as described above. Therefore, the metal pattern MPU, the metal pattern MPV, and the metal pattern MPW are metal patterns MP separated from one another. In addition, the metal pattern MPU, the metal pattern MPV, and the metal pattern MPW are connected to the metal pattern MPT, on which the output terminal LD is mounted, through a plurality of wires BW as illustrated in FIG. 5. Therefore, the wire BW illustrated in FIG. 5 is included in a transmission path for the output of the U-phase, the V-phase, and the W-phase illustrated in FIG. 1.

In addition, in the metal pattern MPH, the same potential (high-side potential E1 (see FIG. 6)) is supplied to each of the U-phase, the V-phase, and the W-phase (see FIG. 1). Therefore, the metal pattern MPH is integrally formed without being divided in accordance with the difference of the U-phase, the V-phase, and the W-phase. In other words, the high-side potential E1 is supplied to each of the plurality of transistors Q1 without interposing the wire therebetween. As a modification example of FIG. 5, note that a method can be considered, the method dividing the metal pattern MPH illustrated in FIG. 5 in accordance with the difference of the U-phase, the V-phase, and the W-phase and electrically connecting the divided metal patterns MPH to one another through a conductive pattern (not illustrated) such as a wire. However, as in the present embodiment, by integrally forming the metal pattern MPH to which the same potential is supplied without dividing this, an impedance of a supply path of the potential E1 can be reduced. Therefore, electrical characteristics of the supply path of the potential E1 can be improved. In addition, the heat generation amount in the metal pattern MPH can be reduced.

In addition, in the metal pattern MPL, the same potential (low-side potential E2 (see FIG. 6)) is supplied to each of the U-phase, the V-phase, and the W-phase (see FIG. 1). Therefore, the metal pattern MPL is integrally formed without being divided in accordance with the difference of the U-phase, the V-phase, and the W-phase. As a modification example of FIG. 5, a method can be considered, the method dividing the metal pattern MPL illustrated in FIG. 5 in accordance with the difference of the U-phase, the V-phase, and the W-phase and electrically connecting the divided metal patterns MPL to one another through a conductive member (not illustrated) such as a wire. In the case of the low-side metal pattern MPL, as illustrated in FIG. 5, the semiconductor chip CP and the metal pattern MPL are electrically connected to each other through the wire BW. Therefore, even when the metal pattern MPL is integrally formed without being divided, the wire BW is not eliminated from the supply path of the potential E2 (see FIG. 6). However, since the supply path of the potential E2 can be stabilized by integrally forming the metal pattern MPL without division, the electrical characteristics of the supply path of the potential E2 can be improved. In addition, the heat generation amount caused when a reflux current flows through the metal pattern MPL can be reduced.

In addition, as illustrated in FIG. 5, one terminal LD is mounted on each of the plurality of metal patterns MPT among the plurality of metal patterns MP. In addition, a plurality of terminals LD are formed in each of the metal pattern MPH and the metal pattern MPL among the plurality of metal patterns MP. In the example illustrated in FIG. 5, one terminal LD is mounted on each of the metal pattern MPH and the metal pattern MPL along the substrate side CSs3 and the substrate side CSs4, which are the short sides among the four sides of the top surface CSt of the ceramic substrate CS1.

In addition, as illustrated in FIG. 5, the terminal LD is not directly connected to each of the metal pattern MPU, the metal pattern MPV, and the metal pattern MPW among the plurality of metal patterns MP. Each of the metal pattern MPU, the metal pattern MPV, and the metal pattern MPW is electrically connected to the metal pattern MPT through the plurality of wires BW. That is, each of the metal pattern MPU, the metal pattern MPV, and the metal pattern MPW is electrically connected to the terminal LD through the plurality of wires BW and the metal pattern MPT.

In addition, a plurality of semiconductor chips CP are mounted on some of the plurality of metal patterns MP (the metal pattern MPH, the metal pattern MPU, the metal pattern MPV, and the metal pattern MPW). Some of the plurality of semiconductor chips CP illustrated in FIG. 5 are semiconductor chips CTH and CTL for switching elements in which the transistors Q1 illustrated in FIG. 6 are formed. In the present embodiment, an IGBT is formed in each of the semiconductor chips CTH and CTL. In addition, other one of the plurality of semiconductor chips CP illustrated in FIG. 5 is a semiconductor chip CD in which the diode D1 illustrated in FIG. 6 is formed.

As described above, when an inductance is connected to the output side of the inverter circuit INV (see FIG. 6), the transistor Q1 (FIG. 6) that is a switching element is connected in antiparallel to the diode D1 (see FIG. 6). As in the MOSFET, when the circuit of the transistor Q1 performing the switching operation and the circuit of the diode D1 supplying the reflux current are embedded in one semiconductor chip CP, one semiconductor chip CP may be mounted in accordance with the number of the switching elements. However, when the IGBT is used as the transistor Q1, it is required to prepare separately the semiconductor chip CP for the diode D1. Therefore, in the present embodiment, as illustrated in FIG. 5, a set of the semiconductor chips CD each including the diode are mounted for the semiconductor chip CTH including the transistor for the high side and the semiconductor chip CTL including the transistor for the low side, respectively.

As illustrated in FIGS. 7 and 8, each of the plurality of semiconductor chips CP has a top surface CPt and a bottom surface CPb located on an opposite side of the top surface (see FIG. 8). The semiconductor chip CTH and the semiconductor chip CTL including the transistors include an electrode PDE for an emitter and an electrode PDG for a gate, which are exposed from the top surface CPt. In addition, the semiconductor chip CTH and the semiconductor chip CTL including the transistors include an electrode PDC for a collector in the bottom surface CPb. The electrode PDC for the collector is fixed to a top surface MPm of the metal pattern MP through a solder SD that is a bonding material. In addition, the electrode PDC for the collector is electrically connected to the metal pattern MP through the solder SD.

Specifically, as illustrated in FIG. 5, the plurality of semiconductor chips CTH are mounted on the metal pattern MPH. In other words, the electrode PDC for the collector (see FIG. 8) of the plurality of semiconductor chips CTH is electrically connected to the integrally-formed metal pattern MPH. In addition, one semiconductor chip CTL is mounted on each of the metal pattern MPU, the metal pattern MPV, and the metal pattern MPW. In other words, the electrode PDC for the collector (see FIG. 8) of the plurality of semiconductor chips CTL is electrically connected to each of the metal pattern MPU, the metal pattern MPV and the metal pattern MPW.

In addition, as illustrated in FIG. 5, a plurality of wires BW are connected to the electrode PDE. Specifically, as illustrated in FIG. 5, the electrode PDE of the high-side semiconductor chip CTH (see FIG. 7) is connected to one of the metal pattern MPU, the metal pattern MPV, and the metal pattern MPW through the plurality of wires BW. That is, the electrode PDE of the high-side semiconductor chip CTH is connected to one of a U-phase output terminal UT (see FIG. 6), a V-phase output terminal VT (see FIG. 6), and a W-phase output terminal WT (see FIG. 6). In addition, as illustrated in FIG. 5, the electrode PDE of the low-side semiconductor chip CTL (see FIG. 7) is connected to the metal pattern MPL through the plurality of wires BW. That is, the electrode PDE of the low-side semiconductor chip CTL is electrically connected to the terminal LT to which the low-side potential E2 illustrated in FIG. 6 is supplied.

In addition, as illustrated in FIG. 5, one wire BW is connected to the electrode PDG. Specifically, as illustrated in FIG. 5, each electrode PDG (see FIG. 7) included in each of the high-side semiconductor chip CTH and the low-side semiconductor chip CTL is electrically connected to the metal pattern MPT through the wire BW. A driving signal for driving the switching operation of the transistors Q1 (see FIG. 6) included in the semiconductor chip CTH and the semiconductor chip CTL is supplied from the metal pattern MPT.

In addition, as illustrated in FIGS. 7 and 8, the semiconductor chip CD with the diode includes an anode electrode PDA exposed from the top surface CPt. In addition, as illustrated in FIG. 8, the semiconductor chip CD includes a cathode electrode PDK in the bottom surface CPb. The cathode electrode PDK is fixed to the top surface MPm of the metal pattern MP through the solder SD that is the bonding material. In addition, the cathode electrode PDK is electrically connected to the metal pattern MP through the solder SD.

Specifically, as illustrated in FIG. 5, the plurality of semiconductor chips CD are mounted on the metal pattern MPH. In other words, the cathode electrodes PDK of the plurality of semiconductor chips CD (see FIG. 8) are electrically connected to the integrally-formed metal pattern MPH. In addition, one semiconductor chip CD is mounted on each of the metal pattern MPU, the metal pattern MPV, and the metal pattern MPW. In other words, the cathode electrode PDK of the semiconductor chip CD (see FIG. 8) is electrically connected to each of the metal pattern MPU, the metal pattern MPV, and the metal pattern MPW.

In addition, as illustrated in FIG. 5, a plurality of wires BW are connected to the electrode PDA. Specifically, as illustrated in FIG. 5, the electrode PDA of the high-side semiconductor chip CD (see FIG. 7) is connected to one of the metal pattern MPU, the metal pattern MPV, and the metal pattern MPW through the plurality of wires BW. In addition, the electrode PDA of the high-side semiconductor chip CD (see FIG. 7) is connected to the output metal pattern MPT through the plurality of wires BW. That is, the electrode PDA of the high-side semiconductor chip CD is connected to one of the U-phase output terminal UT (see FIG. 6), the V-phase output terminal VT (see FIG. 6), and the W-phase output terminal WT (see FIG. 6). In addition, as illustrated in FIG. 5, the electrode PDA of the low-side semiconductor chip CD (see FIG. 7) is connected to the metal pattern MPL through the plurality of wires BW. That is, the electrode PDA of the low-side semiconductor chip CD is electrically connected to the terminal LT to which the low-side potential E2 illustrated in FIG. 6 is supplied.

Each of the plurality of wires BW illustrated in FIG. 5 is a metal wire, and is made of, for example, aluminum in the present embodiment. However, there are various modification examples in the material of the wire BW so that not only aluminum but also gold or silver can be used.

In addition, as illustrated in FIG. 4, a sealing material MG is filled in a space between the cover member CV and the ceramic substrate CS1. Each of the plurality of semiconductor chips CP and each of the plurality of wires BW are sealed by the sealing material MG. The sealing material MG is a member that protects a part of the semiconductor chip CP, the wire BW, and the terminal LD. As the sealing member, there is a method of using a resin material such as an epoxy resin that is cured by heating so as to ensure a certain strength. However, by the curing of the sealing material MG, a stress is caused inside the semiconductor device PKG1 when a temperature of the semiconductor device PKG1 changes because of a difference in a linear expansion coefficient between the ceramic substrate CS1 and the sealing material MG. Therefore, in the present embodiment, the sealing material MG is formed by using a softer resin material than the epoxy resin. Specifically, in the present embodiment, the sealing material MG is a silicone resin that is a polymer compound having a main skeleton formed by a siloxane bond.

The silicone resin has softer characteristics than the epoxy resin. The stress caused when the temperature of the semiconductor device PKG1 changes is reduced by the deformation of the sealing material MG that is the silicone resin.

<Layout of Metal Pattern>

Next, details of the metal patterns illustrated in FIG. 5 will be described. In this section, the overview of the layout of the metal patterns illustrated in FIG. 5 is first described with reference to FIG. 6, and the configuration of the hollow portion DP formed in each of the metal patterns MP is then described.

Figure 9:
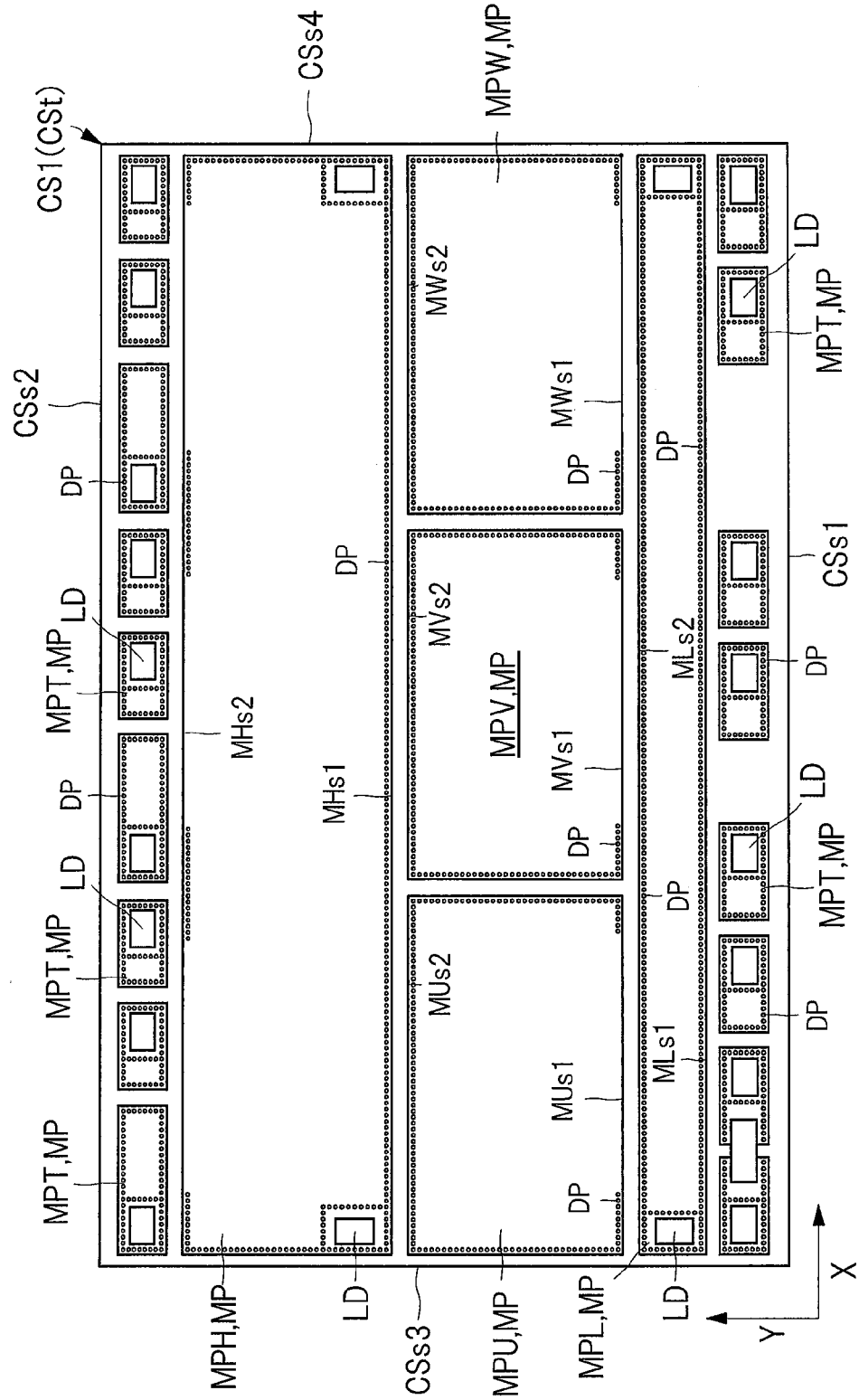
FIG. 9 is a plan view illustrating a layout of a plurality of metal patterns illustrated in FIG. 5.
Figure 10:
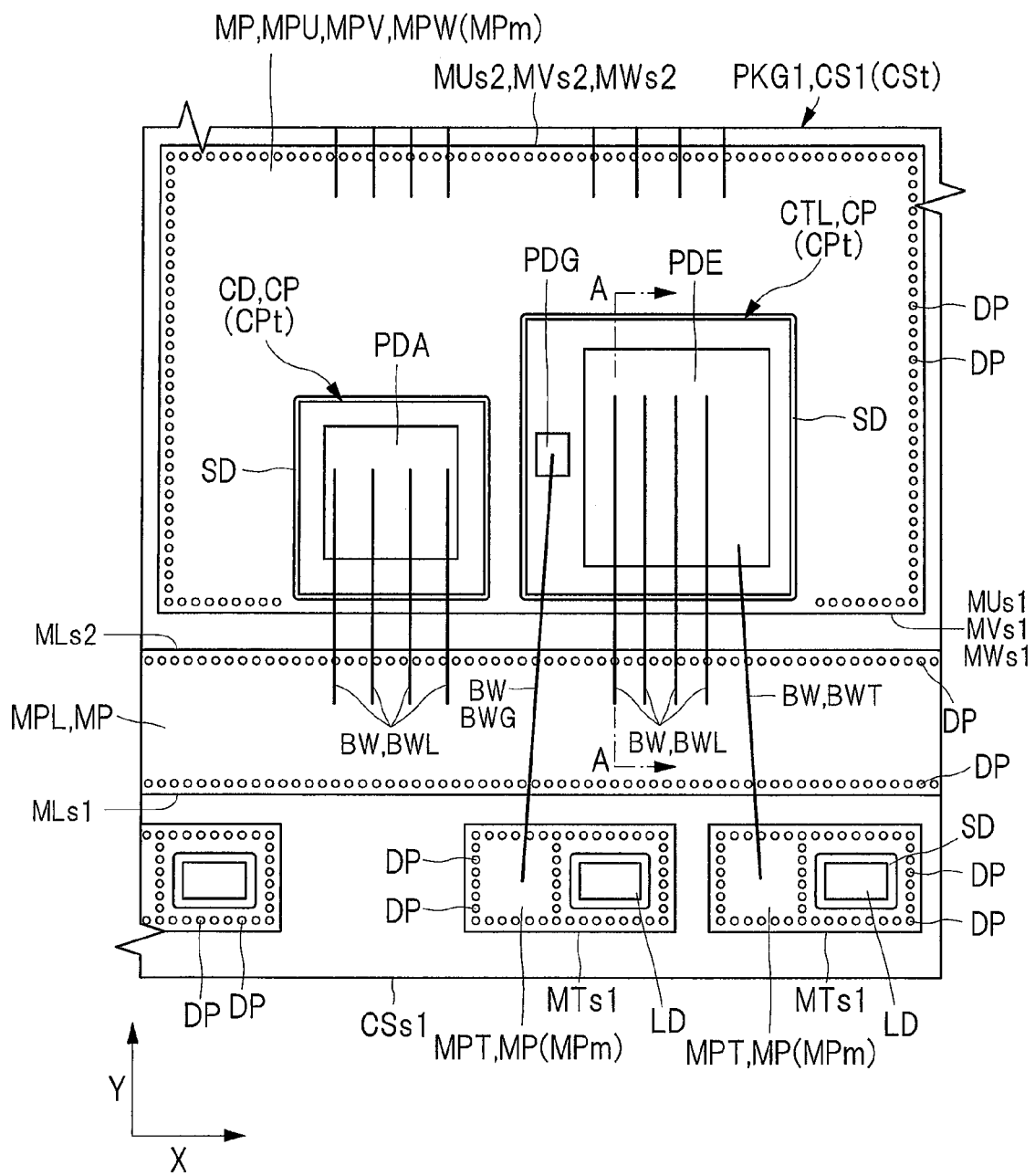
FIG. 10 is an enlarged plan view illustrating a periphery of a semiconductor chip of a low side among the plurality of semiconductor chips illustrated in FIG. 5 so as to be enlarged.
Figure 11:
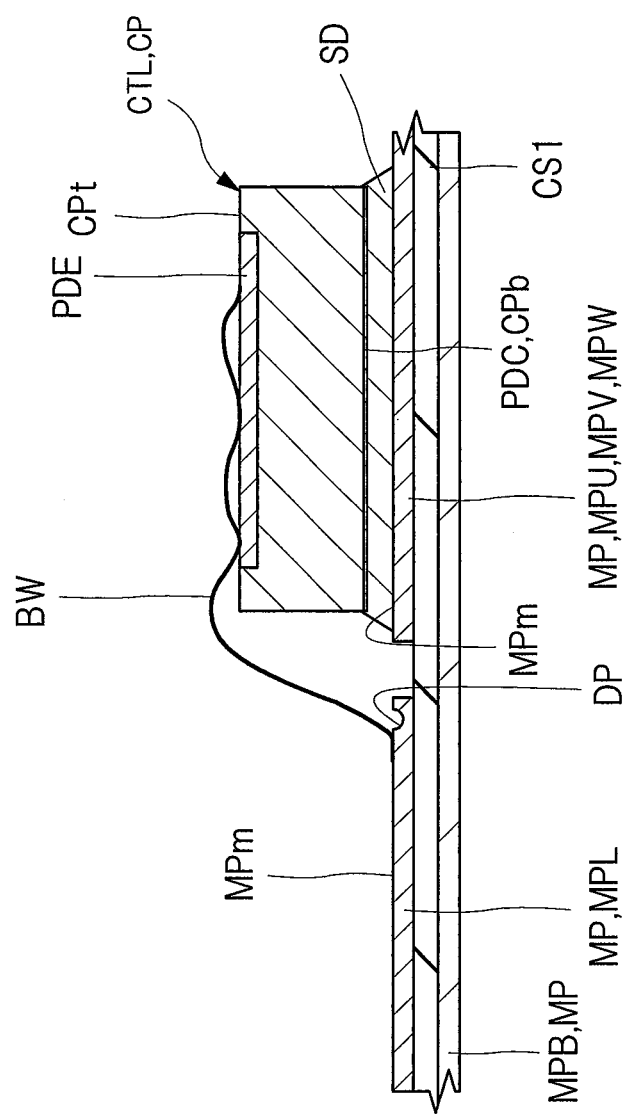
FIG. 11 is an enlarged cross-sectional view taken along a line A-A of FIG. 10.
Figure 12:
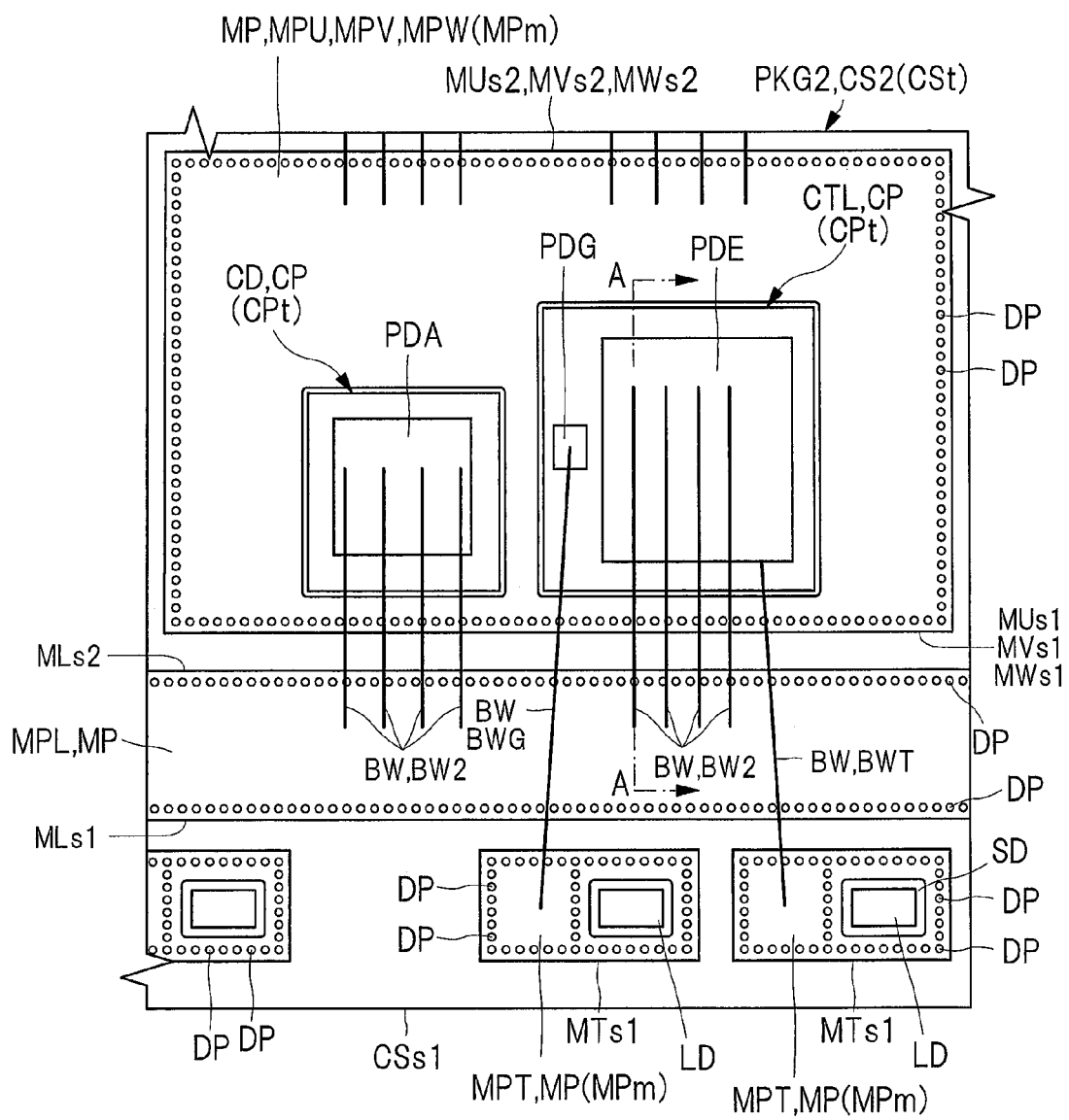
FIG. 12 is a plan view illustrating an examination example corresponding to FIG. 10.
Figure 13:
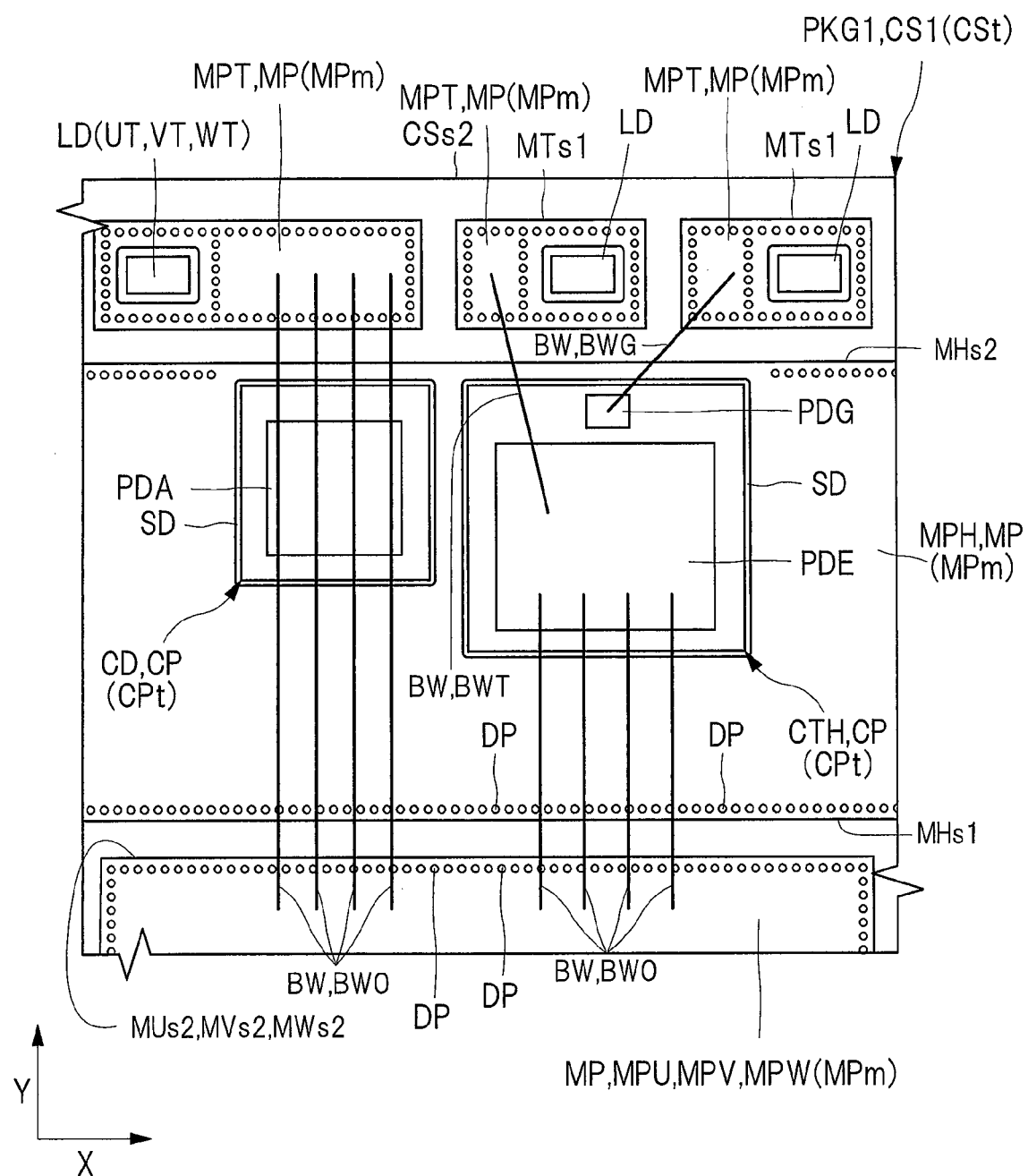
FIG. 13 is an enlarged plan view illustrating a periphery of a semiconductor chip of a high side among the plurality of semiconductor chips illustrated in FIG. 5 so as to be enlarged.

FIG. 9 is a plan view illustrating the layout of the plurality of metal patterns illustrated in FIG. 5. In addition, FIG. 10 is an enlarged plan view illustrating the periphery of the low-side semiconductor chip among the plurality of semiconductor chips illustrated in FIG. 5 so as to be enlarged. In addition, FIG. 11 is an enlarged cross-sectional view taken along a line A-A of FIG. 10. In addition, FIG. 12 is a plan view illustrating an examination example corresponding to FIG. 10. In addition, FIG. 13 is an enlarged plan view illustrating the periphery of the high-side semiconductor chip among the plurality of semiconductor chips illustrated in FIG. 5 so as to be enlarged.

As illustrated in FIG. 9, the metal pattern MPH, to which a relatively high high-side potential E1 (see FIG. 6) is supplied, is included in the plurality of metal patterns MP mounted on the top surface CSt of the ceramic substrate CS1 of the semiconductor device PKG1 according to the present embodiment. The metal pattern MPH is integrally formed without being divided in accordance with the difference of the U-phase, the V-phase, and the W-phase. Therefore, the impedance of the supply path of the potential E1 can be reduced.

In addition, the metal pattern MPL, to which a relatively low low-side potential E2 (see FIG. 6) is supplied, is included in the plurality of metal patterns MP. As similar to the metal pattern MPH, the metal pattern MPL is also integrally formed without being divided in accordance with the difference of the U-phase, the V-phase, and the W-phase. Therefore, in the supply path of the potential E2, the impedance of the portion to the plurality of wires BWL illustrated in FIG. 10.

In addition, the metal pattern MPU, the metal pattern MPV, and the metal pattern MPW, which configure the output nodes of the U-phase, the V-phase, and the W-phase, respectively, are included in the plurality of metal patterns MP. Different potentials are supplied to the metal pattern MPU, the metal pattern MPV, and the metal pattern MPW, so that the patterns MPU, MPV, and MPW have a phase difference of 120 degrees. Therefore, the metal pattern MPU, the metal pattern MPV, and the metal pattern MPW are divided in accordance with the difference of the U-phase, the V-phase, and the W-phase.

In addition, the plurality of metal patterns MPT, on which the input/output terminal LD is mounted, are included in the plurality of metal patterns MP. One terminal LD is mounted on each of the plurality of metal patterns MPT through the solder SD (see FIG. 4). Since one terminal LD is mounted on each of the metal patterns MPT as described above, the plane area of the metal patterns MPT is smaller than the plane areas of the metal pattern MPH, the metal pattern MPL, the metal pattern MPU, the metal pattern MPV, and the metal pattern MPW.

In the present embodiment, terminals other than the supply terminal LD of the potential E1 (see FIG. 6) and the supply terminal LD of the potential E2 (see FIG. 6) are mounted on the plurality of metal patterns MPT, respectively. The terminals LD mounted on the metal patterns MPT include the terminal LD configuring the output nodes of the U-phase, the V-phase, and the W-phase, the terminal LD that transmits the driving signal to the semiconductor chips CTH and CTL (see FIG. 5), and the measurement terminal LD that outputs the potentials of the electrodes PDA (see FIG. 7) of the semiconductor chips CTH and CTL. In addition, in the example illustrated in FIG. 9, the plurality of metal patterns MPT are respectively arranged so as to be next to each other along the X direction at the position closest to the substrate side CSs1 or the substrate side CSs2 among the four sides of the top surface CSt of the ceramic substrate CS1.

In addition, the configuration example of the arrangement of the plurality of metal patterns MP in the example illustrated in FIG. 9 is described in detail as follows. That is, the plurality of metal patterns MPT are arranged along the X direction at the position closest to the substrate side CSs1 among the four sides of the ceramic substrate CS1. In addition, the metal pattern MPL is arranged next to the plurality of metal patterns MPT arranged on the substrate side CSs1 side. In addition, the metal pattern MPU, the metal pattern MPV, and the metal pattern MPW are arranged next to the metal pattern MPL along the X direction. In addition, the metal pattern MPH extending along the X direction is arranged next to the metal pattern MPU, the metal pattern MPV, and the metal pattern MPW. In addition, the plurality of metal patterns MPT are arranged between the metal pattern MPH and the substrate side CSs2 along the X direction.

In addition, when seen in a plan view, the metal pattern MPH of the ceramic substrate CS1 has a side MHs1 extending along the X direction and a side MHs2 located at an opposite side of the side MHs1. The side MHs1 and the side MHs2 are the long sides of the metal pattern MPH, respectively. In addition, the side MHs1 is a side facing each of the metal pattern MPU, the metal pattern MPV, and the metal pattern MPW, and the side MHs2 is a side facing the plurality of metal patterns MPT.

In addition, each of the metal pattern MPU, the metal pattern MPV, and the metal pattern MPW included in the ceramic substrate CS1 of the present embodiment is the metal pattern MP arranged between the metal pattern MPH and the metal pattern MPL. The metal pattern MPU, the metal pattern MPV, and the metal pattern MPW are arranged along the X direction so as to be next to each other. In addition, the area of each of the metal pattern MPU, the metal pattern MPV, and the metal pattern MPW is relatively smaller than the area of the metal pattern MPH.

When seen in a plan view, the metal pattern MPU has a side MUs1 extending along the X direction and a side MUs2 located on an opposite side of the side MUs1. In addition, the side MUs1 is a side facing the metal pattern MPL, and the side MUs2 is a side facing the metal pattern MPH.

In addition, when seen in a plan view, the metal pattern MPV has a side MVs1 extending along the X direction and a side MVs2 located on an opposite side of the side MVs1. In addition, the side MVs1 is a side facing the metal pattern MPL, and the side MVs2 is a side facing the metal pattern MPH.

In addition, when seen in a plan view, the metal pattern MPW has a side MWs1 extending along the X direction and a side MWs2 located on an opposite side of the side MWs1. In addition, the side MWs1 is a side facing the metal pattern MPL, and the side MWs2 is a side facing the metal pattern MPH.

In addition, when seen in a plan view, the metal pattern MPL of the ceramic substrate CS1 of the present embodiment has a side MLs1 extending along the X direction and a side MLs2 located on an opposite side of the side MLs1. The sides MLs1 and MLs2 are the long sides of the metal pattern MPL, respectively. In addition, the side MLs2 is a side facing each of the metal pattern MPU, the metal pattern MPV, and the metal pattern MPW, and the side MLs1 is a side facing the plurality of metal patterns MPT.

<Bonding Strength of Metal Pattern>

As described above, the plurality of metal patterns having different plane areas from one another are bonded onto the top surface CSt side of the ceramic substrate CS1 so that they are separated from one another. Specifically, as illustrated in FIG. 8, each of the plurality of metal patterns MP has a bottom surface MPb facing and contacting the top surface CSt of the ceramic substrate CS1 and a top surface MPm located on an opposite side of the bottom surface MPb. As described above, the top surface CSt of the ceramic substrate CS1 and the bottom surface MPb of the metal pattern MP are directly bonded to each other by using an eutectic reaction.

However, according to the examination made by the inventors of the present invention, it is found out that the metal pattern MP is partially peeled off from the ceramic material in some cases when a temperature cycle load is repeatedly applied to the package since the difference in the linear expansion coefficient between the ceramic material and the metal pattern is large. In addition, it is found out that the metal pattern MP is peeled off in the peripheral portion of each metal pattern MP, and that the peeling caused in the peripheral portion is promoted toward the center portion of the metal pattern MP so as to increase the peeling area.

Accordingly, as in the semiconductor device PKG2 of the examination example illustrated in FIG. 12, the inventors of the present application have examined the configuration of forming the plurality of hollow portions DP along the peripheral portion of each of the plurality of metal patterns MP bonded to the ceramic substrate CS2.

The semiconductor device PKG2 illustrated in FIG. 12 is different from the semiconductor device PKG1 illustrated in FIG. 10 in that the hollow portion DP is regularly formed over the entire periphery in the peripheral portion of each of the metal pattern MPU, the metal pattern MPV, and the metal pattern MPW on which the semiconductor chip CTL being the low-side switching element is mounted.

In addition, each of the plurality of hollow portions DP illustrated in FIG. 12 has the same structure as the hollow portion DP included in the semiconductor device PKG1 illustrated in FIG. 11. The hollow portion DP is a recess (trench, dimple, thin wall part) formed on the top surface MPm side of the metal pattern MP so that the thickness of the metal pattern MP becomes locally thin. In the example illustrated in FIG. 11, the top surface MPm side of the metal pattern MPL is partially removed by for example, etching. The process of partially removing the metal film by etching as described above is referred to as a half etching process.

In the example illustrated in FIG. 11, the depth of the hollow portion DP is about half a thickness of a portion of the metal pattern MP where the hollow portion DP is not formed. For example, when the thickness of the portion of the metal pattern MP where the hollow portion DP is not formed is about 1 mm, each of the thickness of a portion thereof where the hollow portion DP is formed and the depth of the hollow portion DP is about 0.5 mm. In addition, the planar shape of the hollow portion DP illustrated in FIGS. 10 and 12 is circular (but is not limited to the true circular shape in the strict sense). In the examples illustrated in FIGS. 10 and 12, the circular hollow portions DP each having a radius of about 0.5 mm are regularly arranged along the peripheral portions of the metal patterns MP at intervals of about 1 mm.

As illustrated in FIG. 11, the thickness of the metal pattern MP is relatively thin as compared to the peripheral region. When an external force is applied, elastic deformation is easier to occur in the peripheral region of the region, where the hollow portion is formed so that the thickness of the metal pattern MP is relatively thinner than that of the peripheral region, than other regions. Therefore, if a plurality of hollow portions DP are provided in the peripheral portions of the metal pattern MP, when a stress is applied to the peripheral portion of the metal pattern MP, the stress is moderated by the preferential elastic deformation of the peripheral region of the hollow portion DP. As a result, the stress applied to a bonding interface between the metal pattern MP and the ceramic substrate CS1 can be reduced, so that the peeling of the metal pattern MP can be suppressed.

That is, in the semiconductor device PKG1 of the present embodiment and the semiconductor device PKG2 of the examination example illustrated in FIG. 12, the stress applied to the peripheral portions of the metal patterns MP is reduced by providing the plurality of hollow portions DP along the peripheral portions of the metal patterns MP. As described above, note that the case of the provision of the plurality of hollow portions DP in the viewpoint of the reduction in the stress has various modification examples in the shape and depth of the hollow portion DP. The modification examples related to the shape of the hollow portion DP will be described later.

Incidentally, as illustrated in FIG. 11, in the present embodiment, the semiconductor chip CP is mounted on the top surface MPm of the metal pattern MP through the solder SD. The metal pattern MP functions as a wire for supplying a potential to the semiconductor chip CP, and a wire for outputting a potential supplied from the semiconductor chip CP. Therefore, it is required to electrically connect the metal pattern MP and the bottom surface CPb of the semiconductor chip CP. In the present embodiment, by the connection of the metal pattern MP with the semiconductor chip CP by the solder SD, the metal pattern MP and the electrode PDC of the bottom surface CPb of the semiconductor chip CP are electrically connected to each other.

Here, when a hollow portion DP is formed in a region where the semiconductor chip CP is mounted, it is important to prevent the air babuls (voids) from remaining in the hollow portion DP after the solder SD is cured. If the voids remain in the hollow portion DP, the voids cause the reduction in electrical characteristics of the path electrically connecting the metal pattern MP and the bottom surface CPb of the semiconductor chip CP. In addition, if the voids remain in the hollow portion DP, the volume of the voids is changed by a temperature change in the periphery of the void, and the change causes a damage to the solder SD in some cases.

From the above-described viewpoint, it is preferable that a plurality of hollow portions DP are not formed at a position overlapping each of the plurality of semiconductor chips CP in a thickness direction. In addition, it is preferable that the solder SD connecting the semiconductor chip CP and the metal pattern MP is not spread into the plurality of hollow portions DP.

In addition, the plurality of hollow portions DP of the present embodiment are formed for the purpose of the moderation of the stress concentration on the bonding interface between the metal pattern MP and the ceramic substrate CS1 by providing a portion whose plate thickness is locally thin as described above. This case causes deterioration of the stress moderation characteristics when a metal material such as the solder SD is embedded in the hollow portion DP. Therefore, it is preferable that the solder SD is not embedded inside the hollow portion DP from the viewpoint of the moderation of the stress concentration on the bonding interface between the metal pattern MP and the ceramic substrate CS1.

In each of the semiconductor device PKG1 illustrated in FIGS. 10 and 11 and the semiconductor device PKG2 illustrated in FIG. 12, a plurality of hollow portions DP are not formed at a position overlapping each of the plurality of semiconductor chips CP in a thickness direction. In addition, in each of the semiconductor device PKG1 illustrated in FIGS. 10 and 11 and the semiconductor device PKG2 illustrated in FIG. 12, the solder SD connecting the semiconductor chip CP and the metal pattern MP is not spread into the plurality of hollow portions DP.

Therefore, the semiconductor device PKG1 illustrated in FIG. 10 and the semiconductor device PKG2 illustrated in FIG. 12 are the same as each other in that the formation of the voids in the solder SD is avoided. In addition, the semiconductor device PKG1 and the semiconductor device PKG2 are the same as each other in that the deterioration of the stress moderation characteristics of the hollow portion DP due to the solder SD is avoided.

<Low-Side Potential Supply Path>

Next, the semiconductor device PKG1 illustrated in FIGS. 10 and 11 and the semiconductor device PKG2 illustrated in FIG. 12 are from each other in the attention on the shortest distance between the semiconductor chip CTL which is the low-side switching element and the peripheral portion of the top surface MPm of the metal pattern MP in the plurality of semiconductor chips CP illustrated in FIG. 5.

That is, a separation distance between the semiconductor chip CTL illustrated in FIG. 10 and the side MUs1 of the top surface MPm of the metal pattern MPU is shorter than a separation distance between the semiconductor chip CTL illustrated in FIG. 12 and the side MUs1 of the top surface MPm of the metal pattern MPU. In addition, a separation distance between the semiconductor chip CTL illustrated in FIG. 10 and the side MVs1 of the top surface MPm of the metal pattern MPV is shorter than a separation distance between the semiconductor chip CTL illustrated in FIG. 12 and the side MVs1 of the top surface MPm of the metal pattern MPV. In addition, a separation distance between the semiconductor chip CTL illustrated in FIG. 10 and the side MWs1 of the top surface MPm of the metal pattern MPW is shorter than a separation distance between the semiconductor chip CTL illustrated in FIG. 12 and the side MWs1 of the top surface MPm of the metal pattern MPW.

In addition, as illustrated in FIGS. 10 and 11, in the case of the semiconductor device PKG1, no hollow portion DP is formed between the semiconductor chip CTL and the side MUs1 of the top surface MPm of the metal pattern MPU. In addition, no hollow portion DP is formed between the semiconductor chip CTL and the side MVs1 of the top surface MPm of the metal pattern MPV. In addition, no hollow portion DP is formed between the semiconductor chip CTL and the side MWs1 of the top surface MPm of the metal pattern MPW.

That is, when a plurality of hollow portions DP are formed between the semiconductor chip CTL and the side MUs1 of the top surface MPm of the metal pattern MPU as in the semiconductor device PKG2 illustrated in FIG. 12, it is required to increase the separation distance between the semiconductor chip CTL and the side MUs1 of the top surface MPm of the metal pattern MPU in order to prevent the solder SD from being spread to the plurality of hollow portions DP. As a result, in the case of the semiconductor device PKG2, the extension distance (path distance, distance between connecting portions along a loop shape) of the plurality of wires BW2 electrically connecting the electrode PDE of the semiconductor chip CTL and the metal pattern MPL becomes long.

In other words, in the semiconductor device PKG1 illustrated in FIGS. 10 and 11, no hollow portion DP is formed between the semiconductor chip CTL and the side MUs1 of the top surface MPm of the metal pattern MPU, and therefore, the semiconductor chip CTL can be brought close to the side MUs1 of the metal pattern MPU. As a result, the extension distance of the plurality of wires (conductive members) BWL electrically connecting the electrode PDE of the semiconductor chip CTL and the metal pattern MPL can be shortened. In the metal pattern MPL to which the plurality of wires BWL illustrated in FIG. 10 are connected, the terminal LT to which the potential E2 is supplied is mounted on the inverter circuit illustrated in FIG. 6. Therefore, by shortening the extension distance of the wires BWL illustrated in FIG. 10, the impedance of the path that supplies the potential E2 (see FIG. 6) to the low-side transistor Q1 (see FIG. 6) can be reduced. As a result, the electrical characteristics of the inverter circuit illustrated in FIG. 6 can be improved.

In the present section, as an example of the low-side semiconductor chip CP, the path that supplies the potential E2 (see FIG. 6) to the transistor Q1 (see FIG. 6) has been described. However, the same goes for the path that supplies the potential E2 to the diode D1 (see FIG. 6). In the case of the present embodiment, since the transistor Q1 is the IGBT as described above, the semiconductor chip CD in which the diode D1 is formed is mounted next to the semiconductor chip CTL in which the transistor Q1 is formed. The plurality of wires BWL are connected to the electrode PDA of the semiconductor chip CD, and the electrode PDA is electrically connected to the metal pattern MPL through the plurality of wires BWL.

Here, as illustrated in FIG. 10, no hollow portion DP is formed between the low-side semiconductor chip CD and each of the side MUs1, the side MVs1, and the side MWs1 of the top surface MPm of metal pattern MPU. Therefore, the extension distance of the plurality of wires BWL that supplies the potential E2 (see FIG. 6) to the semiconductor chip CD can be shortened. Therefore, by shortening the extension distance of the wires BWL illustrated in FIG. 10, the impedance of the path that supplies the potential E2 (see FIG. 6) to the low-side diode D1 (see FIG. 6) can be reduced.

In addition, as illustrated in FIG. 10, the electrode PDE of the semiconductor chip CTL is connected to one wire BWT. The wire BWT electrically connects the electrode PDE of the semiconductor chip CTL to the metal pattern MPT provided on the peripheral portion side (substrate side CSs1 side) of the ceramic substrate CS1. The output path passing through the wire BWT is connected to the control circuit CMD illustrated in FIG. 1 (specifically, a measurement circuit in the control circuit CMD). By measuring the potential E2 (see FIG. 6) supplied to the low side and transmitting the measured potential E2 to the control circuit CMD as described above, the control circuit CMD can control the operation of the inverter circuit INV illustrated in FIG. 1, based on the value of the potential E2.

Here, from the viewpoint that improves the accuracy of the measured potential, it is preferable to shorten the extension distance of the measurement wire BWT. Accordingly, in the example illustrated in FIG. 10, the wire BWT that measures the supplied potential on the low side is connected to the metal pattern MPT of the substrate side CSs1 side, and the low-side semiconductor chip CTL is mounted so as to be close to the substrate side CSs1 side. That is, as illustrated in FIG. 10, since no hollow portion DP is formed between the low-side semiconductor chip CTL and each of the side MUs1, the side MVs1, and the side MWs1 of the top surfaces MPm of the metal pattern MPU, the metal pattern MPV, and the metal pattern MPW, the extension distance of the measurement wire BWT can be shortened.

In other words, the distance from the semiconductor chip CTL to the side MUs1 of the metal pattern MPU is shorter than the distance from the semiconductor chip CTL to the side MUs2 of the metal pattern MPU. In addition, the distance from the semiconductor chip CTL to the side MVs1 of the metal pattern MPV is shorter than the distance from the semiconductor chip CTL to the side MVs2 of the metal pattern MPV. In addition, the distance from the semiconductor chip CTL to the side MWs1 of the metal pattern MPW is shorter than the distance from the semiconductor chip CTL to the side MWs2 of the metal pattern MPW.

As illustrated in FIG. 10, note that the gate electrode PDG of the semiconductor chip CTL is connected to the metal pattern MPT on the substrate side CSs1 side through one wire BWG. Therefore, by mounting the low-side semiconductor chip CTL so as to be close to the substrate side CSs1, the extension distance of the wire BWG can be shortened. However, a signal that controls the switching operation of the transistor Q1 (see FIG. 6) is supplied to the gate electrode PDG. Therefore, the influence (effect) obtained by reducing the impedance by shortening the extension distance of the wire BW is larger in the plurality of wires BWL or the measurement wire BWT than the wire BWG.

<High-Side Potential Supply Path>

Next, in the attention on the metal pattern MPH on which the semiconductor chip CTH being the high-side switching element is mounted, the high side has a different configuration from the above-described low side. That is, as illustrated in FIG. 13, the semiconductor chip CTH being the high-side switching element is mounted on the metal pattern MPH through the solder SD. As described above, the metal pattern MPH configures the path that supplies the potential E1 (see FIG. 6) to the semiconductor chip CTH. In other words, the path that supplies the potential E1 to the semiconductor chip CTH is configured by two terminals LD mounted on the metal pattern MPH, the metal pattern MPH, and the solder SD connected to the electrode PDC (see FIG. 8) of the semiconductor chip CTH. Therefore, the wire BW is not interposed in the path that supplies the potential E1 to the high-side transistor Q1 (see FIG. 1). Accordingly, from the viewpoint that reduces the impedance of the supply path of the potential E1 illustrated in FIG. 6, the semiconductor chip CTH can be mounted at any position on the metal pattern MPH.

In addition, the electrode PDE of the semiconductor chip CTH illustrated in FIG. 13 is connected to one of the metal pattern MPU, the metal pattern MPV, and the metal pattern MPW through a plurality of wires (conductive members) BWO. The extension distance of the plurality of wires BWO electrically connecting the electrode PDE to one of the metal pattern MPU, the metal pattern MPV, and the metal pattern MPW is longer than the extension distance of the plurality of wires BWL illustrated in FIG. 10.

However, the metal pattern MPU, the metal pattern MPV, and the metal pattern MPW are electrically connected to the output terminal UT, the output terminal VT, and the output terminal WT through a plurality of another wires BWO, respectively. Specifically, the plurality of wires BWO connected to the metal pattern MPU, the metal pattern MPV, and the metal pattern MPW are connected to the electrode PDA of the semiconductor chip CD and are electrically connected to the output terminal UT, the output terminal VT, and the output terminal WT, respectively. That is, the power output from the semiconductor chip CTH is connected to the metal pattern MPT, which is provided on the side MHs2 side of the metal pattern MPH, through one of the metal pattern MPU, the metal pattern MPV, and the metal pattern MPW, which are provided on the side MHs1 side of the metal pattern MPH.

Therefore, in the case of the wiring structure illustrated in FIG. 13, the path distance of the transmission path connecting the electrode PDE of the semiconductor chip CTH to the output terminals UT, VT, and WT is not largely different between the case of the arrangement of the semiconductor chip CTH so as to be close to the side MHs1 side and the case of the arrangement of the semiconductor chip CTH so as to be close to the side MHs2 side.

On the other hand, as illustrated in FIG. 13, the electrode PDE of the semiconductor chip CTH is connected to one wire BWT. The wire BWT electrically connects the electrode PDE of the semiconductor chip CTH to the metal pattern MPT provided on the peripheral portion side of the ceramic substrate CS1. The output path passing through the wire BWT is connected to the control circuit CMD (specifically, a measurement circuit in the control circuit CMD) illustrated in FIG. 1. By measuring the potential of the output node and transmitting the measured potential to the control circuit CMD as described above, the control circuit CMD can control the operation of the inverter circuit INV illustrated in FIG. 1, based on the value of the potential of the output node.

Here, as described above, from the viewpoint that improves the accuracy of the measured potential, it is preferable to shorten the extension distance of the measurement wire BWT. Accordingly, in the example illustrated in FIG. 13, as illustrated in FIG. 13, no hollow portion DP is formed between the high-side semiconductor chip CTH and the side MHs2 of the top surface MPm of the metal pattern MPH. Therefore, even if the semiconductor chip CTH is mounted so as to be close to the side MHs2 side of the metal pattern MPH, the solder SD can be prevented from being spread to the hollow portion DP. In the present embodiment, the semiconductor chip CTH is mounted close to the side MHs2 side of the metal pattern MPH. In other words, the distance from the semiconductor chip CTH to the side MHs2 of the metal pattern MPH is shorter than the distance from the semiconductor chip CTH to the side MHs1 of the metal pattern MPH.

That is, in the present embodiment, the wire BWT that measures the supplied potential on the high side is connected to the metal pattern MPT on the substrate side CSs2 side, and the high-side semiconductor chip CTH is mounted so as to be close to the substrate side CSs2 side. Therefore, since the extension distance of the measurement wire BWT can be shortened, the accuracy of measuring the potential of the output node can be improved.

In addition, in the example illustrated in FIG. 13, as described above, the high-side semiconductor chip CTH is mounted on the top surface MPm of the metal pattern MPH so as to be close to the substrate side CSs2 side. Accordingly, the extension distance of the plurality of wires BWO electrically connecting the semiconductor chip CTH to one of the metal pattern MPU, the metal pattern MPV, and the metal pattern MPW facing the side MHs1 of the metal pattern MPH is long than that of the plurality of wires BWL illustrated in FIG. 10. Therefore, as illustrated in FIG. 13, even when the plurality of hollow portions DP are formed between the semiconductor chip CTH and the side MHs1 of the metal pattern MPH, the solder SD from being spread within the hollow portions DP can be prevented.

Figure 14:
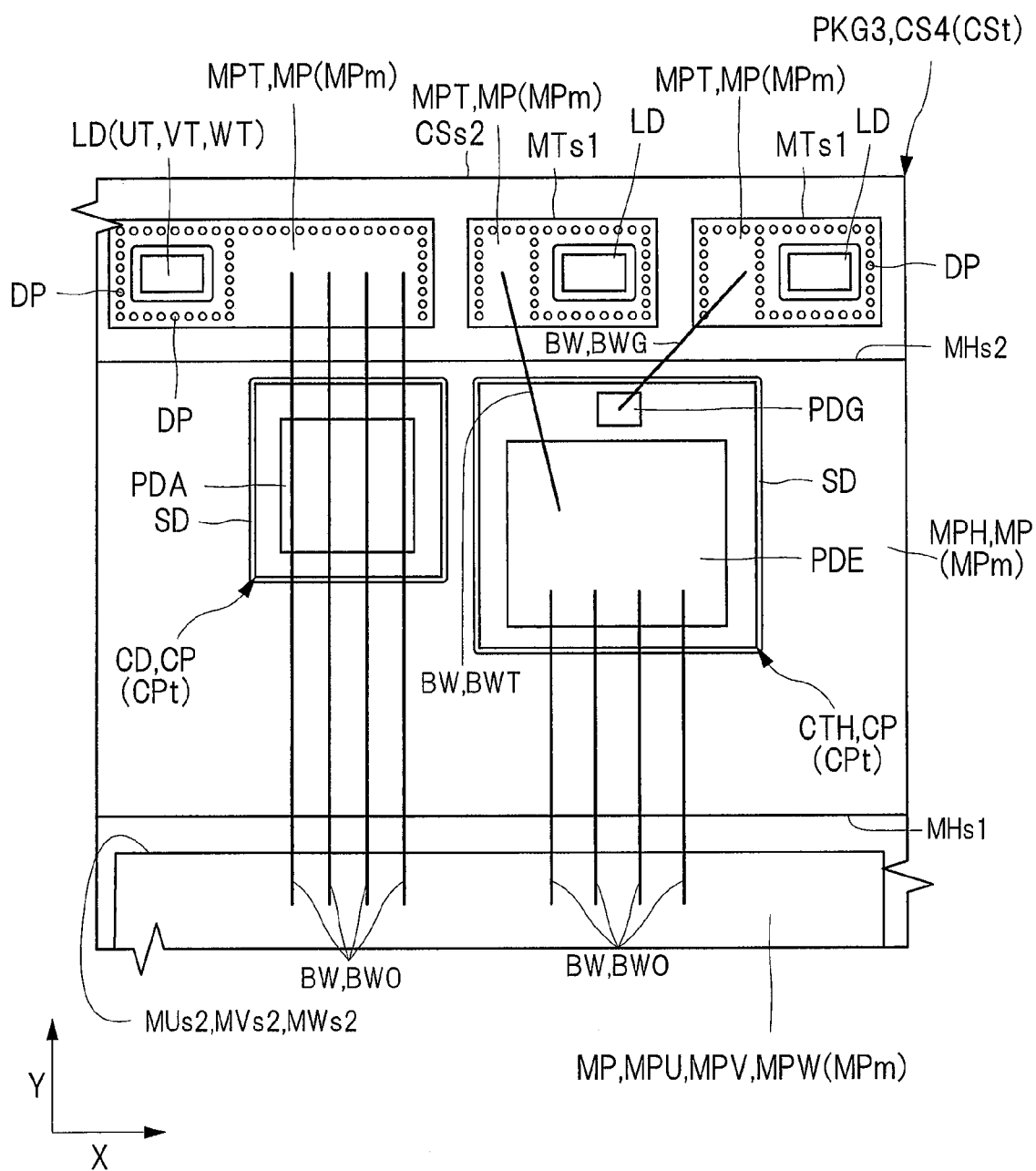
FIG. 14 is an enlarged plan view illustrating a periphery of a semiconductor chip of a high side of a semiconductor device according to a modification example of FIG. 13 so as to be enlarged.

In the example illustrated in FIG. 13, the plurality of hollow portions DP are formed between the semiconductor chip CTH and the side MHs1 of the metal pattern MPH. However, as in a semiconductor device PKG3 of a modification example illustrated in FIG. 14, even when the semiconductor chip CTH is mounted so as to be close to the side MHs2 side of the top surface MPm of the metal pattern MPH, the plurality of hollow portions DP may not be provided between the semiconductor chip CTH and the side MHs1 of the metal pattern MPH. FIG. 14 is an enlarged plan view illustrating a periphery of a high-side semiconductor chip of a semiconductor device according to a modification example of FIG. 13 so as to be enlarged. Although details will be described later, there are a place where the peeling off at the bonding interface between the metal pattern MP and the ceramic substrate CS1 described above is easy to occur and a place where the peeling off is difficult to occur, and a region where the hollow portion DP is to be formed can be determined in accordance with the easiness of the occurrence of the peeling off.

Figure 15:
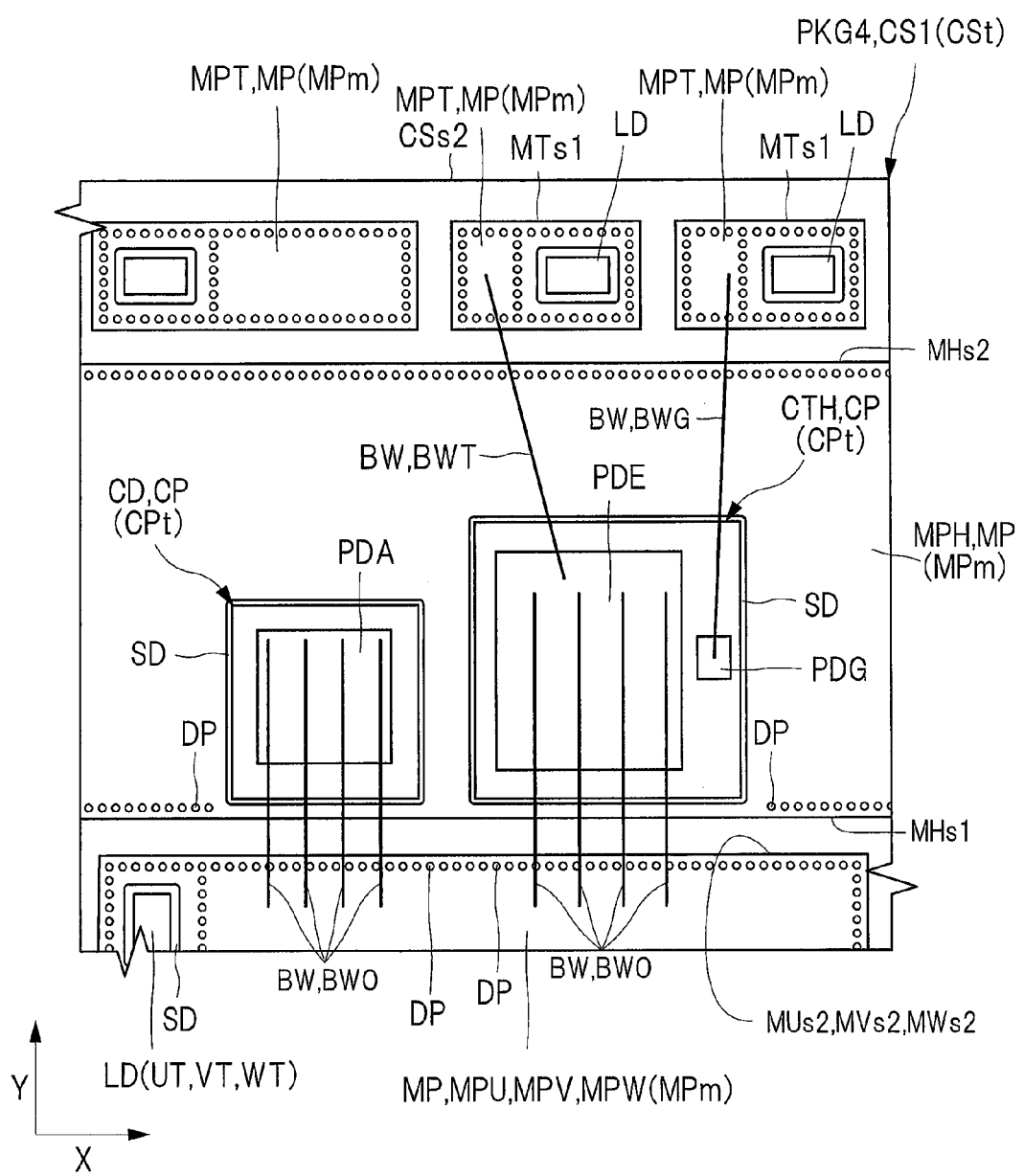
FIG. 15 is an enlarged plan view illustrating a periphery of a semiconductor chip of a high side of a semiconductor device according to another modification example of FIG. 13 so as to be enlarged.

In addition, in the example illustrated in FIG. 13, the high-side semiconductor chip CTH is mounted so as to be close to the substrate side CSs2 side. However, if priority is given to the reduction in the impedance of the transmission path connected to the output node, a semiconductor chip CTH may be mounted so as to be close to a side MHs1 side of a metal pattern MPH as in a semiconductor device PKG4 of a modification example illustrated in FIG. 15. FIG. 15 is an enlarged plan view illustrating a periphery of a high-side semiconductor chip of a semiconductor device according to another modification example of FIG. 13 so as to be enlarged.

In the example of the semiconductor device PKG4 illustrated in FIG. 15, a plurality of hollow portions DP are not provided between the semiconductor chip CTH and the side MHs1 of the metal pattern MPH, and the semiconductor chip CTH is mounted so as to be close to the side MHs1 side of the metal pattern MPH. In this case, the extension distance of the plurality of wires BWO configuring the transmission path connected to the output node illustrated in FIG. 15 can be set as long as that of the plurality of wires BWL illustrated in FIG. 10.

In addition, in the modification example illustrated in FIG. 15, one of the output terminal UT, the output terminal VT, and the output terminal WT is mounted on each of the metal pattern MPU, the metal pattern MPV, and the metal pattern MPW through the solder SD. In this case, since no wire BW is interposed in the transmission path of each of the metal pattern MPU, the metal pattern MPV, and the metal pattern MPW and each of the output terminal UT, the output terminal VT, and the output terminal WT, the impedance of the output node can be reduced.

However, in the case of the modification example illustrated in FIG. 15, the extension distance of the wire BWT configuring the path that measures the potential of the output node is longer than that of the extension distance of the wire BWT illustrated in FIG. 10. That is, the modification example illustrated in FIG. 15 is an embodiment that priority is given to the reduction in the impedance of the transmission path that outputs the power rather than the reduction in the impedance of the path that measures the potential of the output node.

<Tendency of Occurrence of Peeling>

Figure 16:
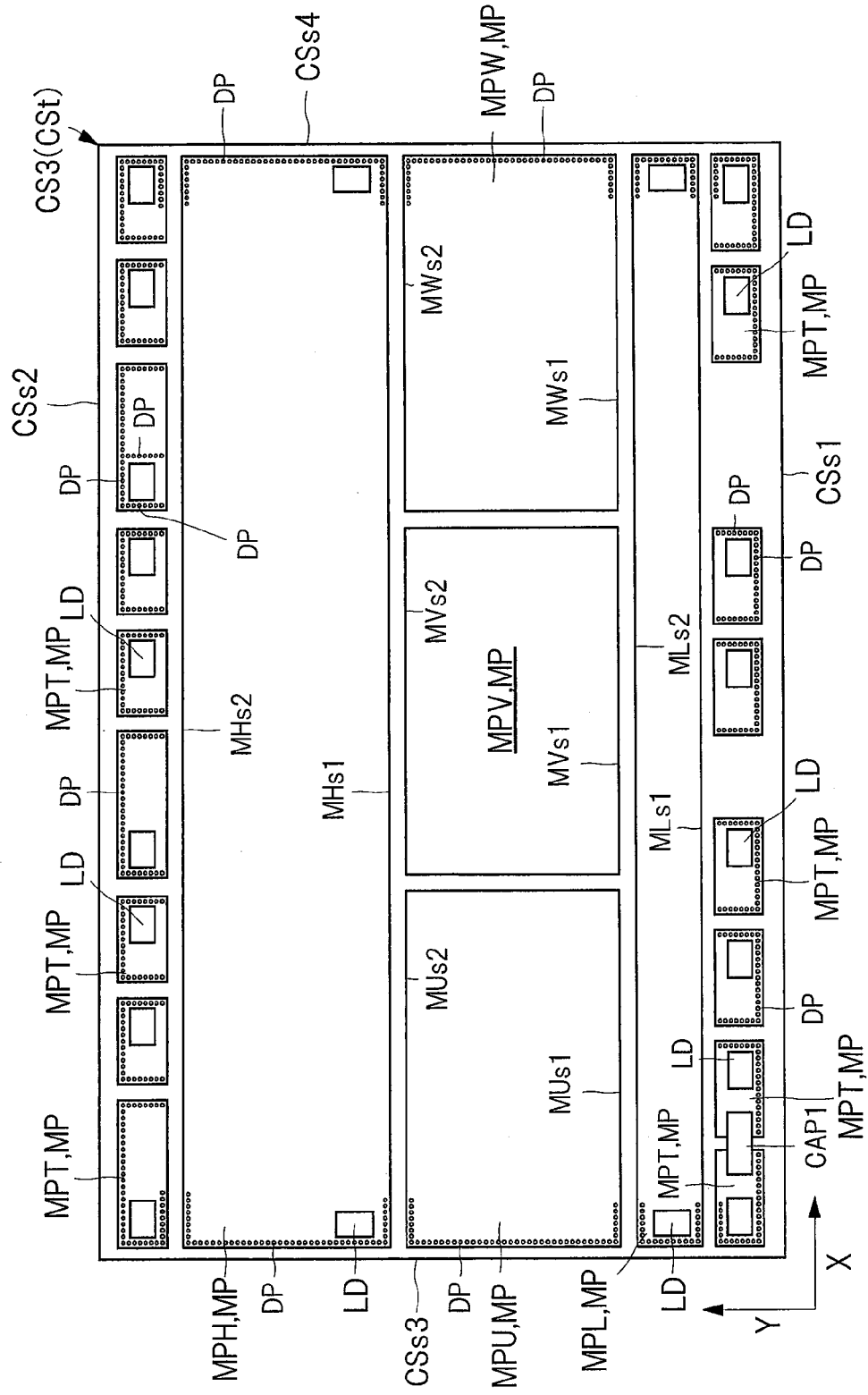
FIG. 16 is a plan view illustrating a layout of a plurality of metal patterns according to a modification example of FIG. 9.
Figure 17:
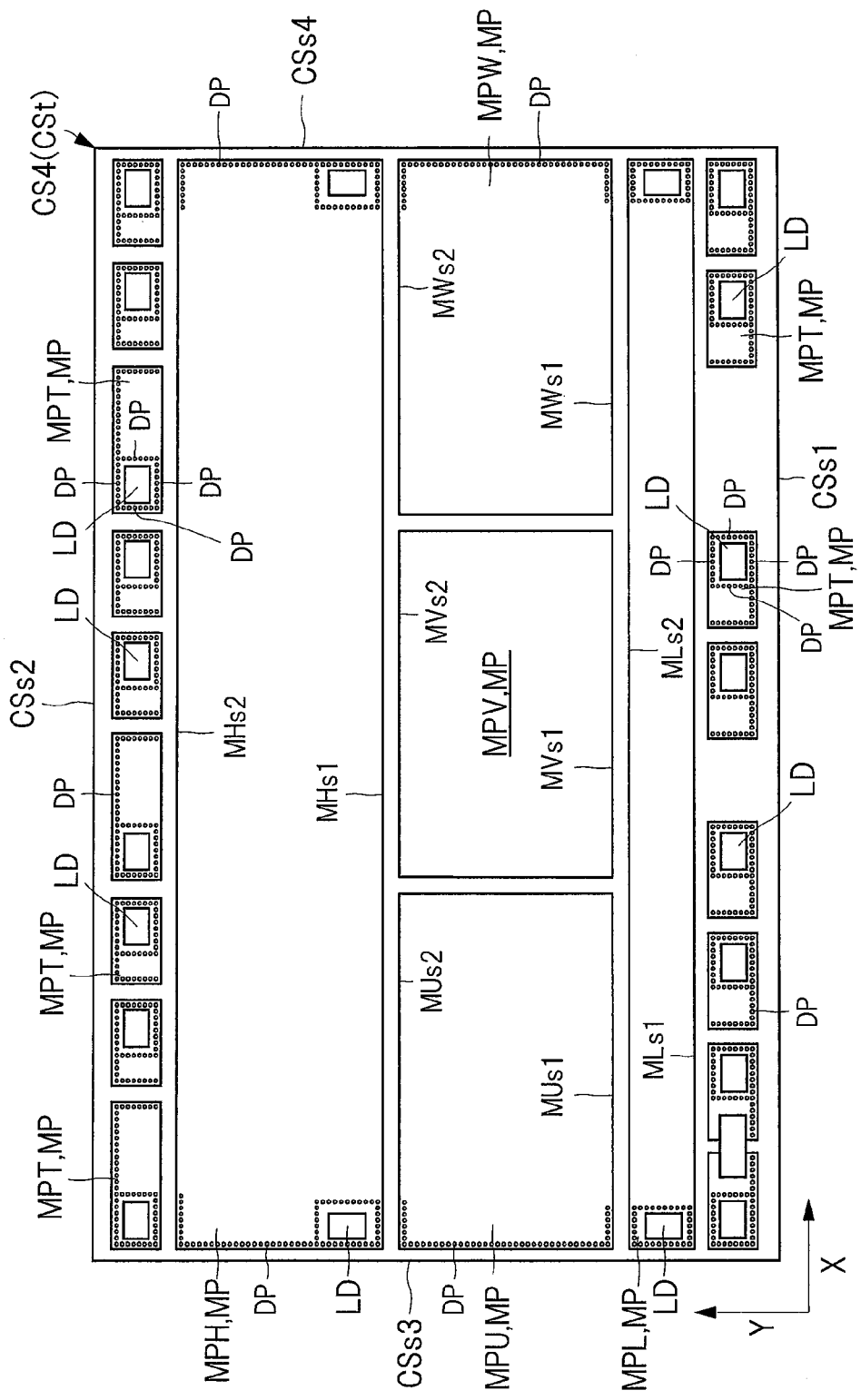
FIG. 17 is a plan view illustrating a layout of a plurality of metal patterns according to another modification example of FIG. 9.
Figure 18:
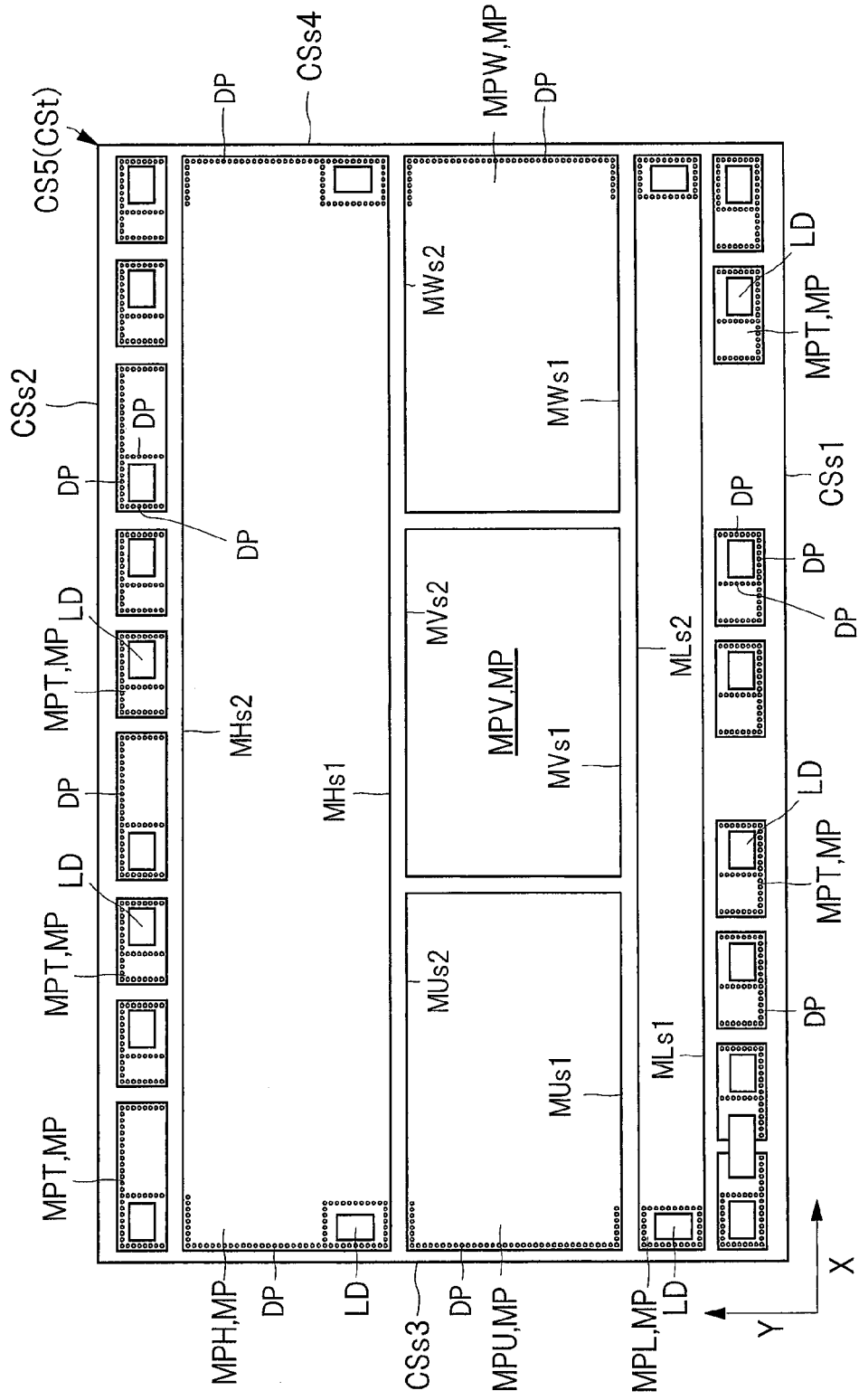
FIG. 18 is a plan view illustrating a layout of a plurality of metal patterns according to another modification example of FIG. 9.

Next, a region where the peeling easily occurs at the bonding interface between the metal pattern MP and the ceramic substrate CS1 described above will be described. Each of FIGS. 16 to 18 is a plan view illustrating the layout of the plurality of metal patterns according to the modification example of FIG. 9.

First, the embodiment of the ceramic substrate CS1 illustrated in FIG. 9 is an embodiment in which the hollow portion DP is provided in each portion having a possibility of the occurrence of the peeling as described below. As the result examined by the inventors of the present application as described above, the above-described peeling occurs in the peripheral portion of the metal pattern MP, and the peeling progresses toward the center portion, and therefore, the peeling range increases. Therefore, by providing the hollow portion DP in each portion having the possibility of the occurrence of the peeling, occurrence of a start point from which the peeling progresses can be suppressed. In the example illustrated in FIG. 9, the plurality of hollow portions DP are formed so as to continuously surround the peripheral portions of the plurality of metal patterns MP, except for apart of the side MUs1, the side MVs1, and the side MWs1 and a plurality of portions of the side MHs2.

However, when the examination has been further made, the stress to be a cause of the occurrence of the peeling increases as a distance from the center of the top surface CSt of the ceramic substrate CS1 increases. That is, as in the ceramic substrate CS3 of the modification example illustrated in FIG. 16, it is preferable that the hollow portion DP is formed in each of the plurality of metal patterns MP located at the position closest to the peripheral portion in the top surface CSt of the ceramic substrate CS3.

In the example illustrated in FIG. 16, the plurality of hollow portions DP are formed in the metal patterns MP having the side (hereinafter, referred to as the outermost peripheral side) provided adjacent to one of the substrate side CSs1, the substrate side CSs2, the substrate side CSs3, and the substrate side CSs4 configuring the peripheral portion of the ceramic substrate CS3 among the plurality of metal patterns MP. In addition, the plurality of hollow portions DP are provided in the above-described outermost peripheral side among four sides of the plurality of metal patterns MP. In other words, in each of the plurality of metal patterns MP, the plurality of hollow portions DP are formed in a side close to the peripheral portion of the ceramic substrate CS3

In addition, in the example illustrated in FIG. 16, the plurality of hollow portions DP are arranged even in a part of the side intersecting with the above-described outermost peripheral side in consideration of the fact that the stress concentration tends to occur at corners of the metal pattern MP (intersections of four sides of the metal pattern MP).

According to the modification example illustrated in FIG. 16, the occurrence of the peeling can be suppressed by providing the plurality of hollow portions DP particularly in a portion where the peeling at the bonding interface with the ceramic substrate CS3 particularly tends to occur in the plurality of metal patterns MP.

In addition, according to the modification example illustrated in FIG. 16, the plurality of hollow portions DP are provided in the above-described outermost peripheral side among the four sides included in the plurality of metal patterns MP. Therefore, as similar to the semiconductor device PKG3 of the modification example described with reference to FIG. 14, the plurality of hollow portions DP are not formed between a wire bonding region to which the wire BW is connected in the top surface MPm of the metal pattern MP and the peripheral portion of the top surface MPm of the metal pattern MP. Therefore, the extension distance of the wire BW can be further closer than that of the semiconductor device PKG1 illustrated in FIG. 13.

Note that FIG. 14 illustrates a wire BWO connecting the semiconductor chip CTH to one of the metal pattern MPU, the metal pattern MPV, and the metal pattern MPW. However, according to the modification example illustrated in FIG. 16, no hollow portion DP is formed in the peripheral portion of each of the metal patterns MPU, MPV, and MPW. Therefore, in the case of the modification example illustrated in FIG. 16, the extension distance of each of the plurality of wires BWL illustrated in FIG. 10 can be shortened.

In addition, according to the further examination on the cause of the occurrence of the peeling by the inventors of the present application, when a member is mounted on the metal pattern MP, it is found out that a correlation is established among the linear expansion coefficient of the mounted member, the height of the member after mounting, and the ease of the occurrence of the peeling. That is, it is found out that the peeling tends to occur in the periphery of the member when the member having the larger linear expansion coefficient than those of the plurality of semiconductor chips CP illustrated in FIG. 5 and extending to a higher position than the top surface CPt (see FIG. 4) of each of the plurality of semiconductor chips CP is mounted on the metal pattern MP.

In the present embodiment, the member corresponding to the above-described condition is the terminal LD mounted on the metal pattern MP through the solder SD as illustrated in FIG. 4. In the example illustrated in FIG. 4, the linear expansion coefficient of the ceramic material configuring the ceramic substrate CS1 is about 3 to about 7. In addition, a semiconductor substrate configuring most of the semiconductor chip CP is of, for example, silicon (Si), and the linear expansion coefficient of the entire semiconductor chip CP is about 3. On the other hand, the linear expansion coefficient of the plurality of terminals LD is about 18. In addition, the linear expansion coefficient of the solder SD bonding the terminals LD is about 20 to about 30.

Here, according to the examination result of the inventors of the present application, the peeling is more difficult to occur in the vicinity of the portion on which the semiconductor chip CP is mounted than the vicinity of the portion on which the terminal LD is mounted. In addition, when a member such as a ceramic capacitor having a linear expansion coefficient lower than the linear expansion coefficient of the semiconductor chip CP is mounted on the metal pattern MP through the solder SD (see FIG. 4), the peeling has not been observed in the vicinity of a mounting region of the ceramic capacitor. For example, in the example illustrated in FIG. 16, a capacitor CAP1 is mounted over two metal patterns MP through the solder. In this case, it has been found out that the peeling tends to occur in the vicinity of the terminal LD more than the vicinity of the capacitor CAP1. In addition, when the solder SD (see FIG. 4) is simply bonded on the metal patterns MP, the peeling has not been observed in the vicinity of the solder SD.

In addition, as illustrated in FIG. 4, the plurality of wires BW electrically connecting the semiconductor chip CP and the metal patterns MP fall under the above-described condition. However, the peeling has not been observed in the vicinity of the portion to which the wire BW is bonded in the metal patterns MP. Therefore, it is considered that the condition that the size (volume and weight) of the member to be the cause of the occurrence of the peeling is also related to the above-described condition under which the above-described peeling tends to occur. Qualitatively, such a member mounted on the metal pattern MP by using the solder SD is considered as the cause of the occurrence of the peeling.

From the above-described result, as in the terminal LD illustrated in FIG. 4, it has been found out that the peeling tends to occur in the vicinity of the region having the member mounted thereon through the solder SD, the member having the larger linear expansion coefficient than that of the semiconductor chip CP and extending to a higher position than the top surface CPt of the semiconductor chip CP. It is considered that this is because a difference in a deformation amount at the bonding interface between the metal pattern MP and the ceramic substrate CS1 is increased by mounting the member having the large linear expansion coefficient on the metal pattern MP.

Accordingly, from the viewpoint that suppresses the peeling caused by the mounting of the terminal LD, it is preferable that the plurality of hollow portions DP are provided so as to surround the periphery of the region on which each of the plurality of terminals LD is mounted as in the ceramic substrate CS4 of the modification example illustrated in FIG. 17.

According to the modification example illustrated in FIG. 17, the stress caused by the temperature change is easily moderated by forming the plurality of hollow portions DP in the periphery of the region on which the terminal LD is mounted, and therefore, the occurrence of the peeling in the periphery of the region on which the terminal LD is mounted can be suppressed.

In addition, since the ceramic substrate CS4 illustrated in FIG. 17 includes the structure described with reference to the ceramic substrate CS3 illustrated in FIG. 16, the effects described with reference to FIG. 16 can be obtained.

In addition, in the modification example illustrated in FIG. 17, the plurality of hollow portions DP are provided so as to continuously surround the periphery of the region on which the plurality of terminals LD are mounted, respectively. However, as another modification example of FIG. 17, the plurality of hollow portions DP may not be provided at aside that exists at the farthest position from the peripheral portion of the top surface CSt of the ceramic substrate CS5 among four sides surrounding the region on which the terminals LD are mounted, as in a ceramic substrate CS5 illustrated in FIG. 18.

According to FIG. 18, since no hollow portion DP is formed at one side among the four sides surrounding the region on which the terminals LD are mounted, the solder SD (see FIG. 4) is difficult to spread into the hollow portions DP more than the ceramic substrate CS4 illustrated in FIG. 17. From the viewpoint that suppresses the occurrence of the peeling, the configuration of the ceramic substrate CS4 illustrated in FIG. 17 is more preferable. However, it is difficult to provide the plurality of hollow portions DP so as to continuously surround the periphery of the region on which the terminals LD are mounted in relation to the plane area of the metal pattern MPT in some cases. In such a case, such an embodiment as the ceramic substrate CS5 illustrated in FIG. 18 is preferable.

In addition, since the ceramic substrate CS5 illustrated in FIG. 18 includes the structure described with reference to the ceramic substrate CS3 illustrated in FIG. 16, the effects described with reference to FIG. 16 can be obtained. In addition, since the plurality of hollow portions DP are formed in the periphery of the region on which the terminals LD are mounted, the ceramic substrate CS5 illustrated in FIG. 18 can suppress the peeling caused by the mounting of the terminals LD more than the ceramic substrate CS3 illustrated in FIG. 16.

In addition, as illustrated in FIGS. 17 and 18, the peeling caused by the mounting of the terminals LD occurs in the metal pattern MPH and the metal pattern MPL in addition to the plurality of metal patterns MPT having a relatively small plane area. Therefore, as illustrated in FIGS. 17 and 18, it is preferable that the plurality of hollow portions DP are provided in the periphery of the region on which the terminals LD are mounted in each of the metal pattern MPH and the metal pattern MPL.

<Structure of Hollow Portion>

Figure 19:
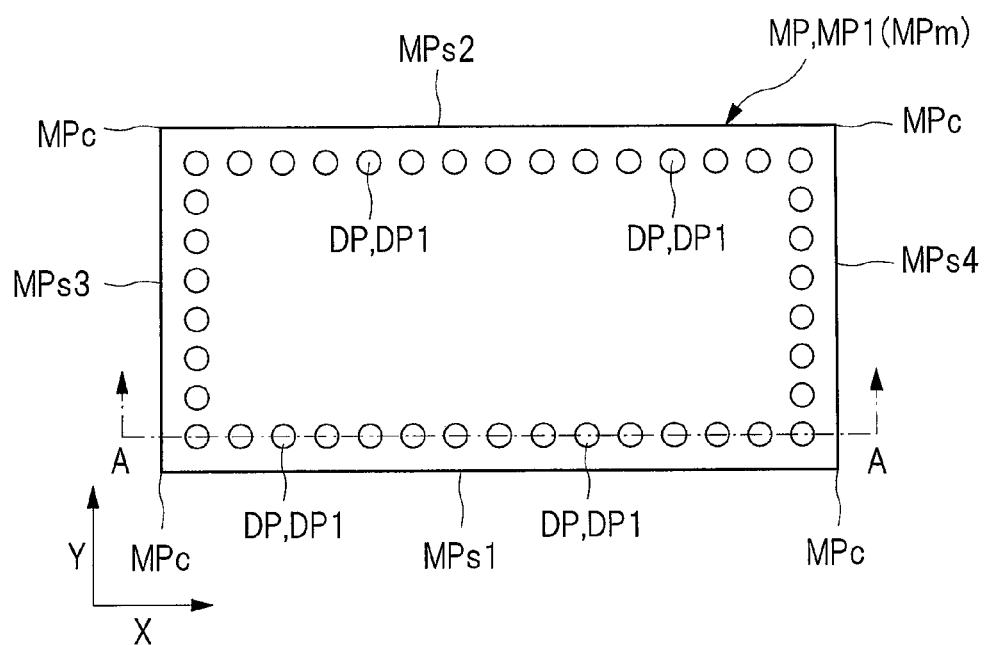
FIG. 19 is a plan view schematically illustrating an example in which a plurality of hollow portions illustrated in FIG. 9 are regularly provided in peripheral portions of metal patterns.
Figure 20:
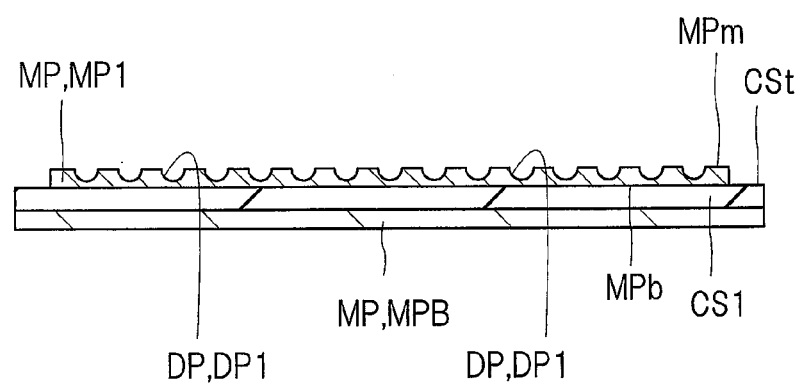
FIG. 20 is an enlarged cross-sectional view taken along a line A-A of FIG. 19.
Figure 21:
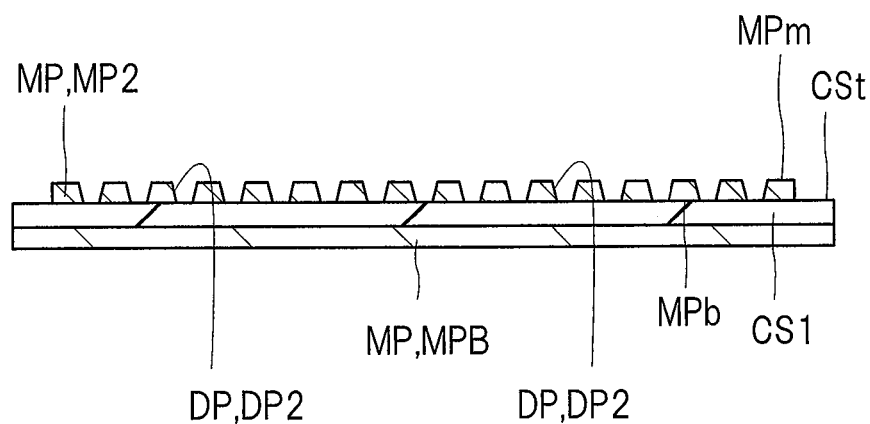
FIG. 21 is an enlarged cross-sectional view illustrating a modification example of FIG. 20.
Figure 22:
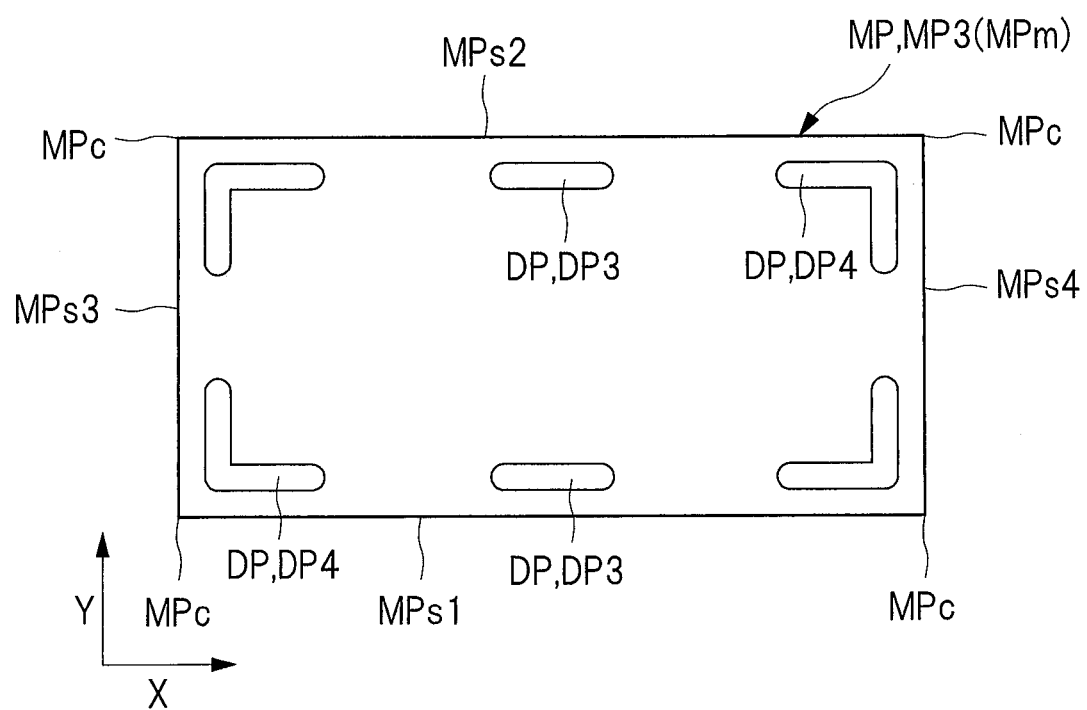
FIG. 22 is a plan view illustrating a modification example of FIG. 19.

Next, the structure of the above-described hollow portion DP will be described. FIG. 19 is a plan view schematically illustrating an example in which a plurality of hollow portions illustrated in FIG. 9 is regularly provided in peripheral portions of metal patterns. In addition, FIG. 20 is an enlarged cross-sectional view taken along a line A-A of FIG. 19. In addition, FIG. 21 is an enlarged cross-sectional view illustrating a modification example of FIG. 20. In addition, FIG. 22 is a plan view illustrating a modification example of FIG. 19.

The metal patterns MP1 illustrated in FIGS. 19 and 20 are model patterns obtained by simplifying a state of formation of a plurality of hollow portions DP in a peripheral portion of each of the plurality of metal patterns MP illustrated in FIG. 9. In addition, the hollow portions DP1 illustrated in FIG. 19 have the same structure as that of the hollow portions DP illustrated in FIG. 11.

The top surface MPm of the metal pattern MP1 illustrated in FIG. 19 has a side MPs1 extending along the X direction in the peripheral portion, a side MPs2 located on an opposite side of the side MPs1, a side MPs3 extending along the Y direction perpendicular to the X direction, and a side MPs4 located on an opposite side of the side MPs3. In addition, the four sides configuring the peripheral portion of the top surface MPm intersect with each other, and the metal pattern MP1 has four corners MPc that are intersections of the four sides.

In addition, a plurality of hollow portions DP1 are regularly arranged in the peripheral portion of the top surface MPm of the metal pattern MP1 along each of the four sides. In the example illustrated in FIGS. 19 and 20, the hollow portion DP1 is formed by the above-described half etching process. Therefore, as illustrated in FIG. 20, the deepest position (deepest portion) of the hollow portion DP1 is provided between the top surface MPm and the bottom surface MPb of the metal pattern MP1, and the underlying ceramic substrate CS1 is not exposed.

However, as the modification example of FIG. 20, the deepest portion of the hollow portion DP2 may reach the top surface CSt of the ceramic substrate CS1, as in the plurality of hollow portions DP2 provided in the metal pattern MP2 illustrated in FIG. 21. When a stress caused by a temperature change is applied to the metal pattern MP2 where these hollow portions DP2 are formed, the stress can be moderated by elastically deforming a surrounding metal so that an opening shape of the hollow portion DP2 is changed.

In addition, as a modification example of the planar shape of the hollow portion DP, the hollow portion DP may have an elliptical shape as in the hollow portion DP3 provided in the metal pattern MP3 illustrated in FIG. 22. When an opening area of one hollow portion DP3 increases, the metal pattern MP3 is easy to be deformed. On the other hand, when a plurality of hollow portions DP are regularly arranged as illustrated in FIG. 19, a stress concentration is difficult to occur.

In addition, as a modification example of the planar shape of the hollow portion DP, the hollow portion DP may have an L-shape with a bent portion, as in the hollow portion DP4 provided in the metal pattern MP3 illustrated in FIG. 22. The hollow portion DP4 illustrated in FIG. 22 is arranged so that the bent portion is located on a diagonal line connecting a corner MPc of the metal pattern MP3. The stress occurring at the bonding interface between the metal pattern MP and the ceramic substrate CS1 (see FIG. 19) easily increases in the corner MPc of the metal pattern MP. Therefore, the occurrence of the peeling is easily suppressed by forming the L-shaped hollow portion DP4 having a relatively large planar area at the corner MPc of the metal pattern MP.

Although the illustration is omitted, note that each of the hollow portion DP3 or the hollow portion DP4 illustrated in FIG. 22 may be formed by a half etching process as in the hollow portion DP1 illustrated in FIG. 20, or may be formed so as to penetrate through the metal pattern MP3 as in the hollow portion DP2 illustrated in FIG. 21.

In addition, a plurality of types of hollow portions DP3 and DP4 may be formed in one metal pattern MP3, as in the metal pattern MP3 illustrated in FIG. 22.

<Method of Manufacturing Semiconductor Device>

Figure 23:
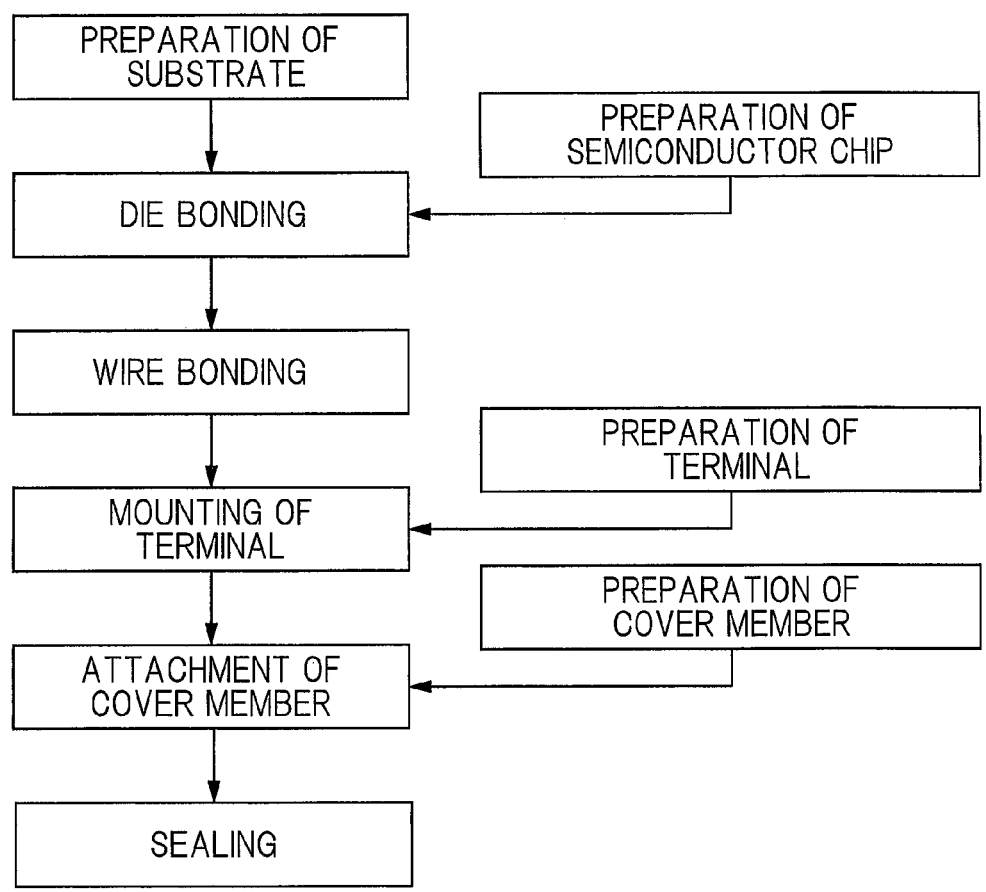
FIG. 23 is an explanatory diagram illustrating an assembly flow of the semiconductor device illustrated in FIG. 2.

Next, a process of manufacturing the semiconductor device PKG1 described with reference to FIGS. 1 to 13 will be described so as to follow a process flow illustrated in FIG. 23. FIG. 23 is an explanatory diagram illustrating an assembly flow of the semiconductor device illustrated in FIG. 2.

<Preparation of Substrate>

First, in a substrate preparing process illustrated in FIG. 23, the ceramic substrate illustrated in FIG. 9 is prepared. The ceramic substrate CS1 prepared in the present process is, for example, a ceramic containing alumina as a main component, and the plurality of metal patterns MP are bonded to the top surface CSt and the bottom surface CSb (see FIG. 4).

The plurality of metal patterns MP are, for example, a laminated film formed by laminating a nickel (Ni) film on a surface of a copper (Cu) film, and is directly bonded to the top surface CSt or the bottom surface CSb of the ceramic substrate CS1 by using the eutectic reaction. In addition, the nickel film is laminated on the copper film by an electroplating method.

In addition, a plurality of hollow portions DP are formed on the top surfaces MPm of the plurality of metal patterns MP.

Note that the overlap descriptions for the layout of the plurality of metal patterns MP and the shape or layout of the hollow portions DP will be omitted since they have been already described.

<Die Bond>

Next, in a die bond process illustrated in FIG. 23, as illustrated in FIG. 5, the plurality of semiconductor chips CP are mounted on the metal pattern MP of the ceramic substrate CS1.

In the present process, a plurality of (three in the present embodiment) semiconductor chips CTH and a plurality (three in the present embodiment) of semiconductor chips CD are mounted on the metal pattern MPH, to which the high-side potential E1 (see FIG. 6) is supplied, among the plurality of metal patterns MP. In addition, one semiconductor chip CTL and one semiconductor chip CD are mounted on each of the metal patterns MPU, MPV, and MPW connected to the alternate-current power output terminal among the plurality of metal patterns MP. In addition, the semiconductor chip CP is not mounted on the metal pattern MPL, to which the low-side potential E2 (see FIG. 6) is supplied, among the plurality of metal patterns MP. In addition, the semiconductor chip CP is not mounted on the plurality of metal patterns MPT for connecting the input/output terminals LD among the plurality of metal patterns MP.

In addition, as illustrated in FIG. 8, in the present process, each of the plurality of semiconductor chips CP is mounted by a so-called face-up mounting method in a state in which the bottom surface CPb of the semiconductor chip CP and the top surface MPm of the metal pattern MP face each other. In addition, electrodes PDK and PDC are formed in the bottom surface CPb of the semiconductor chip CP, and the semiconductor chip CP is mounted through the solder SD in order to electrically connect the electrodes PDK and PDC and the metal pattern MP.

A method of mounting the semiconductor chip CP through the solder SD is performed as follows. First, a paste-like solder is applied on a region where the semiconductor chip is to be mounted. A solder component and a flux component are contained in the paste-like solder. Next, a plurality of semiconductor chips CP are prepared (in a semiconductor chip preparing process illustrated in FIG. 23), and each of the semiconductor chips CP is pressed against the solder. A reflow process (heating process) is performed on the solder in a state in which the plurality of semiconductor chips CP are temporarily bonded on the metal pattern MP through the paste-like solder. The solder is melted by the reflow process so that a part of the solder is connected to the metal pattern MP and another part of the solder is connected to the electrodes PDK and PDC of the semiconductor chip CP. Then, when the solder is cured by cooling, each of the semiconductor chips CP is fixed on the metal pattern MP.

At this time, according to the present embodiment, no hollow portion DP (see FIG. 9) is formed at a position overlapping each of the plurality of semiconductor chips CP in a thickness direction in the top surface MPm of the metal pattern MP. Therefore, when the solder SD is embedded in the hollow portion DP, occurrence of voids can be prevented.

In addition, in the present process, no hollow portion DP is formed in an area where the solder SD connecting the semiconductor chip CP and the metal pattern MP spreads. Therefore, the solder SD is embedded in the hollow portion DP, and the stress moderation characteristics of the hollow portion DP can be prevented from being deteriorated.

When chip parts (electronic parts, functional elements, etc.) other than the semiconductor chip CP such as the capacitor CAP1 in addition to the semiconductor chip CP are mounted, note that the chip parts can be mounted in batch in the present process.

<Wire Bond>

Next, in a wire bond process illustrated in FIG. 23, the semiconductor chip CP and the metal pattern MP are electrically connected to each other through the wire (conductive member) BW as illustrated in FIG. 5.

In the present process, the emitter electrodes PDE (see FIG. 8) of the plurality of high-side semiconductor chips CTH and the plurality of metal patterns MPU, MPV, and MPW are electrically connected to one another through the plurality of wires BW, respectively.

In addition, in the present process, the emitter electrodes PDE (see FIG. 8) of the plurality of low-side semiconductor chips CTL and the plurality of metal patterns MPL are electrically connected to one another through the plurality of wires BW, respectively.

In addition, in the present process, the gate electrodes PDG (see FIG. 8) of the plurality of high-side semiconductor chips CTH and the gate electrodes PDG of the plurality of low-side semiconductor chips CTL are electrically connected to one another through the plurality of metal patterns MPT and wires BW, respectively.

In addition, in the present process, the anode electrodes PDA of the plurality of high-side semiconductor chips CD, the metal pattern MPU, the metal pattern MPV, and the metal pattern MPW, and the plurality of metal patterns MPT are electrically connected to one another through the plurality of wires BW, respectively. As illustrated in FIG. 13, a plurality of portions can be electrically connected to one another by one wire BW. In the example illustrated in FIG. 13, one end of the wire BW is connected to any one of the metal pattern MPU, the metal pattern MPV, and the metal pattern MPW first. Next, a middle portion of the wire BW is connected to the anode electrode PDA of the semiconductor chip CD. Next, the other end of the wire BW is connected to the metal pattern MPT.

In addition, in the present process, the anode electrodes PDA of the plurality of low-side semiconductor chips CD and the plurality of metal patterns MPT are electrically connected to one another through the plurality of wires BW, respectively.

Note that the present embodiment shows the example of the usage of the wire as the member electrically connecting the semiconductor chip CP and the metal pattern MP. However, as a modification example, a bar-shaped metal (for example, an aluminum ribbon) can be also used. Alternatively, they can be connected to each other through a solder by using a patterned metal plate (copper clip).

<Terminal Mounting>

Next, in a terminal mounting process illustrated in FIG. 23, a terminal LD is mounted on the plurality of metal patterns MP as illustrated in FIG. 5. The terminal LD is a lead terminal for electrically connecting the plurality of patterns to an external device not illustrated, and has one elongating end connected to the metal pattern MP. In the example illustrated in FIG. 4, each of the plurality of terminals LD is mounted on the metal pattern MP through the solder SD.

In addition, in the example illustrated in FIG. 5, the terminals LD are mounted on both ends in a longitudinal direction (the substrate side CSs3 side and the substrate side CSs4 side which are the short sides) in the metal pattern MPH to which the high-side potential is supplied and the metal pattern MPL to which the low-side potential is supplied, among the plurality of metal patterns MP. In addition, one terminal LD is mounted on each of the plurality of metal patterns MPT. In addition, the terminal LD is not directly connected to each of the metal pattern MPU, the metal pattern MPV, and the metal pattern MPW.

<Cover Member Attachment>

Next, in a cover member attaching process illustrated in FIG. 23, the cover member CV is adhered and fixed so as to cover the top surface CSt of the ceramic substrate CS1 as illustrated in FIG. 4. The peripheral portion of the top surface CSt of the ceramic substrate CS1 and the cover member CV are attached and fixed to each other through an adhesive BD1.

At this time, a plurality of through-holes THL are formed on a top surface CVt of the cover member CV, and the plurality of terminals LD are inserted into the plurality of through-holes THL, respectively.

In the example illustrated in FIG. 4, note that the cover member CV is integrally formed with a portion where the plurality of through-holes THL are formed and a portion that is adhered and fixed to the ceramic substrate CS1. However, as a modification example, the portion that is adhered and fixed to the ceramic substrate CS1 and the portion where the plurality of through-holes THL are formed may be provided as separable independent members. In this case, even when the layout of the terminals LD is changed, only the portion where the plurality of through-holes THL are formed may be replaced.

<Sealing>

Next, in a sealing process illustrated in FIG. 23, a sealing material MG is supplied into a space surrounded by the ceramic substrate CS1 and the cover member CV as illustrated in FIG. 4, and parts of each of the plurality of terminals LD, which are the plurality of semiconductor chips CP and the plurality of wires BW are sealed. The sealing material MG is a gel-like material. A through-hole not illustrated for supply is formed in a part of the cover member CV, and the gel-like sealing material MG is filled from the through-hole.

Here, the gel-like sealing member MG is embedded in the plurality of hollow portions DP illustrated in FIG. 9. However, since the gel-like material is a soft material that is more easily deformed than the peripheral region of the hollow portion DP, the stress moderation characteristics of the hollow portion DP is not deteriorated even when the gel-like material is embedded in the hollow portion DP.

The semiconductor device PKG1 described with reference to FIGS. 1 to 13 can be obtained by the above-described processes. Then, the semiconductor device is subjected to necessary inspections and tests such as an appearance inspection or an electrical test, and is shipped. In addition, the semiconductor device is embedded in the power conversion system illustrated in FIG. 1.

MODIFICATION EXAMPLE

In the foregoing, the invention made by the present inventors has been concretely described based on the embodiments. However, it is needless to say that the present invention is not limited to the foregoing embodiments and various modifications and alterations can be made within the scope of the present invention. Note that some modification examples have been described also in the embodiments. However, representative modification examples other than the modification examples described above in the embodiments will be described.

Modification Example 1

For example, the above-described embodiments have described the power conversion circuit that outputs the three-phase alternate-current power by using three high-side transistors Q1 and three low-side transistors Q1 as the switching elements. However, the number of the switching elements has various modification examples.

For example, when a half-bridge circuit is configured by using one high-side transistor and one low-side transistor, single-layer alternate-current power can be output. In addition, when single-layer alternate-current is output by a full-bridge circuit, four transistors Q1 are used.

Modification Example 2

In addition, for example, various modification examples have been described as above. However, a combination of the above-described modification examples can also be applied.

What is claimed is:
1. An electronic device comprising:
a substrate having a top surface and a bottom surface opposite to the top surface, a shape in a plan view of the top surface being comprised of a rectangle having a first long side, a second long side, a first short side and a second short side,
a first metal pattern formed on the top surface of the substrate;
a second metal pattern formed on the top surface of the substrate, and spaced apart from the first metal pattern;
a third metal pattern formed on the top surface of the substrate, and spaced apart from the first and second metal patterns;
a fourth metal pattern formed on the top surface of the substrate, and spaced apart from the first, second and third metal patterns;
a first semiconductor chip mounted on a first region in a surface of the first metal pattern via a first bonding material;
a second semiconductor chip mounted on a first region in a surface of the second metal pattern via a second bonding material;
a first terminal mounted on a first region in a surface of the third metal pattern via a third bonding material, and connected with the third metal pattern via the third bonding material;

a second terminal mounted on a first region in a surface of the fourth metal pattern via a fourth bonding material, and connected with the fourth terminal via the fourth bonding material;

a cover member adhered to the substrate, and covering a second region in the surface of the first metal pattern, which is not overlapped with the first semiconductor chip and the first bonding material, a second region in the surface of the second metal pattern, which is not overlapped with the second semiconductor chip and the second bonding material, a second region in the surface of the third metal pattern, which is not overlapped with the first terminal and the third bonding material, a second region in the surface of the fourth metal pattern, which is not overlapped with the second terminal and the fourth bonding material, the first semiconductor chip and the second semiconductor chip; and a sealing material sealing the first semiconductor chip, the second semiconductor chip, a part of the first terminal and a part of the second terminal, wherein, in the plan view, the first region the first metal pattern, the first region of the second metal pattern, the first region of the third metal pattern and the first region of the fourth metal pattern are arranged along the short side of the substrate, wherein, in the plan view, the first region of each of the first and second metal patterns is located between the third metal pattern and the fourth metal pattern, wherein, in the plan view, the first region of the first metal pattern is located between the third metal pattern and the first region of the second metal pattern, wherein no pattern is located between the third metal pattern and the first long side of the substrate, and located between the fourth metal pattern and the second long side, and wherein dimples are formed in each of the second region of the third metal pattern and the second region of the fourth metal pattern, but not formed in each of the first region of the first metal pattern, the first region of the second metal pattern, the first region of the third metal pattern and the first region of the fourth metal pattern.

2. The semiconductor device according to claim 1,
wherein, in the plan view, first dimples of the dimples, which are formed in the second region of the third metal pattern, are arranged along a side of the surface of the third metal pattern, and
wherein, in plan view, second dimples of the dimples, which are formed in the second region of the fourth metal pattern, are arranged along a side of the surface of the fourth metal pattern.

3. The semiconductor device according to claim 1,
wherein the first semiconductor chip has a first transistor, a first upper surface, a first gate electrode formed on the first upper surface, a first emitter electrode formed on the first upper surface, a first lower surface opposite to the first upper surface, and a first collector electrode formed on the first lower surface,
wherein the first bonding material is comprised of solder,
wherein the first collector electrode of the first semiconductor chip is electrically connected with the first metal pattern via the first bonding material, and
wherein third dimples of the dimples are formed in the second region of the first metal pattern, and arranged along a side of the surface of the first metal pattern in the plan view.

4. The semiconductor device according to claim 3,
wherein the second semiconductor chip has a second transistor, a second upper surface, a second gate electrode formed on the second upper surface, a second emitter electrode formed on the second upper surface, a second lower surface opposite to the second upper surface, and a second collector electrode formed on the second lower surface, and
wherein the second bonding material is comprised of solder, and
wherein the first emitter electrode of the first semiconductor chip is electrically connected with the second collector electrode of the second semiconductor chip via a first wire, the second metal pattern and the second bonding material.

5. The semiconductor device according to claim 4,
wherein fourth dimples of the dimples are formed in the second region of the second metal pattern, and arranged along a side of the surface of the fourth metal pattern in the plan view.

6. The semiconductor device according to claim 4,
wherein a fifth metal pattern is formed on the top surface of the substrate, and located between the second metal pattern and the fourth metal pattern in the plan view, and
wherein the second emitter electrode of the second semiconductor chip is electrically connected with the fifth metal pattern via a second wire.

7. The semiconductor device according to claim 6,
wherein fifth dimples of the dimples are formed on a surface of the fifth metal pattern, and arranged along a side of the surface of the fifth metal pattern in the plan view.

* * * * *